United States Patent
Fujimoto et al.

(10) Patent No.: US 11,637,530 B2
(45) Date of Patent: Apr. 25, 2023

(54) OSCILLATING ELEMENT

(71) Applicant: CANON KABUSHIKI KAISHA, Tokyo (JP)

(72) Inventors: Kokichi Fujimoto, Kanagawa (JP); Yoshinori Tateishi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/670,586

(22) Filed: Feb. 14, 2022

(65) Prior Publication Data
US 2022/0263466 A1   Aug. 18, 2022

(30) Foreign Application Priority Data

Feb. 17, 2021 (JP) ................................. 2021-023370
Jan. 7, 2022 (JP) ................................. 2022-001697

(51) Int. Cl.
| H03B 7/08 | (2006.01) |
| H04B 1/18 | (2006.01) |
| H04B 1/16 | (2006.01) |
| H03H 11/52 | (2006.01) |

(52) U.S. Cl.
CPC ............ *H03B 7/08* (2013.01); *H04B 1/1607* (2013.01); *H04B 1/18* (2013.01); *H03H 11/52* (2013.01)

(58) Field of Classification Search
CPC .......... H03B 7/08; H04B 1/1607; H04B 1/18; H03H 11/52
USPC ... 331/107 T, 107 G, 115, 132, 154, 107 SL; 343/844, 750, 751.7 MS
See application file for complete search history.

(56) References Cited

U.S. PATENT DOCUMENTS

| 9,391,428 | B2  | 7/2016  | Koyama et al. |
| 10,277,167 | B2  | 4/2019  | Sekiguchi |
| 10,897,073 | B2* | 1/2021  | Sato ........................ H01Q 1/38 |
| 2015/0123741 | A1* | 5/2015 | Koyama ................. H03B 7/08 331/107 T |
| 2015/0303559 | A1  | 10/2015 | Tateishi |
| 2016/0373061 | A1  | 12/2016 | Sekiguchi |
| 2022/0173515 | A1  | 6/2022  | Koyama et al. |

FOREIGN PATENT DOCUMENTS

JP    2015-180049 A    10/2015

* cited by examiner

Primary Examiner — Arnold M Kinkead
(74) Attorney, Agent, or Firm — Venable LLP

(57) ABSTRACT

An oscillating element includes a substrate, negative resistance elements which are electrically connected to the substrate, antennas which are electrically connected one-to-one to each negative resistance element and which transmit or receive an electromagnetic wave, a pad electrically connected to a power supply source for supplying power to the antennas, and a conductor which electrically connects the pad and the antennas to each other. The conductor is constituted of a common wiring that is common to the antennas and individual wirings from the common wiring to each antenna. The individual wirings differ from each other with respect to a sectional area, resistivity, and a length in accordance with a position on the substrate of an antenna connected to each wiring to reduce a difference in wiring resistances caused based on a distance between the antenna connected to each wiring and the pad.

10 Claims, 20 Drawing Sheets

B-B'

OSCILLATING ELEMENT

BACKGROUND OF THE INVENTION

Field of the Invention

The present disclosure relates to an oscillating element that oscillates an electromagnetic wave in a terahertz wave frequency band.

Description of the Related Art

An electromagnetic wave of which a frequency band ranges from 30 GHz to 300 THz is referred to as a terahertz wave. Absorption peaks derived from structures and states are present in the terahertz wave frequency band with respect to many organic molecules including biomaterials, pharmaceutical products, and electronic materials. In addition, terahertz waves have high transmittivity with respect to materials such as paper, ceramic, resins, and cloth. In recent years, research and development of imaging techniques and sensing techniques which utilize such characteristics of terahertz waves are underway.

Structures which integrate a negative resistance element and a resonator and which have an electromagnetic gain in the terahertz region such as a resonant tunneling diode (RTD) and a Gunn diode are well known as oscillating elements of such terahertz waves. In particular, structures integrating an RTD and an antenna are showing promise as oscillating elements that operate at room temperature in a frequency range in the vicinity of 1 THz.

However, generally, there is a downward trend of oscillating element output as oscillation frequencies become higher. In consideration thereof, arranging structures integrating a negative resistance element and a resonator on a same substrate and creating an array of such structures are used as one of effective means to achieve an increase in output.

In Japanese Patent Application Laid-open No. 2015-180049, antennas are connected to each other by microstrip lines to realize phase synchronization in anticipation of increased output. However, since a length of wiring that electrically connects a power supply unit (hereinafter, a pad) to the respective antennas in the array is not necessarily consistent among the antennas, wiring resistance values differ among the antennas and a deviation in drive voltage arises among the antennas.

Furthermore, an oscillation frequency is known to change when drive voltage changes within a range of a negative resistance region. Therefore, a problem arises in that a deviation in oscillation frequency among antennas causes an increase in output to become insufficient when synthesizing electromagnetic waves of the respective antennas in the array.

SUMMARY OF THE INVENTION

In consideration thereof, an object of the present disclosure is to provide a technique for matching, among a plurality of antennas in an oscillating element, resistance values of wirings that connect a power supply pad and the antennas to each other.

According to an aspect of the present disclosure, it is provided an oscillating element, including a substrate, a plurality of negative resistance elements which are electrically connected to the substrate, a plurality of antennas which are electrically connected one-to-one to each of the plurality of negative resistance elements and which transmit or receive an electromagnetic wave, a pad electrically connected to a power supply source for supplying power to the plurality of antennas, and a conductor which electrically connects the pad and the plurality of antennas to each other, wherein the conductor is constituted of a wiring that is common to the plurality of antennas and individual wirings from the common wiring to each of the plurality of antennas, and each of the individual wirings differ from each other with respect to at least one of a sectional area, resistivity, and a length in accordance with a position on the substrate of an antenna connected to each wiring so as to reduce a difference in wiring resistances which is caused based on a distance between the antenna connected to each wiring and the pad.

Further features of the present invention will become apparent from the following description of exemplary embodiments with reference to the attached drawings.

DESCRIPTION OF THE EMBODIMENTS

Figure 1:
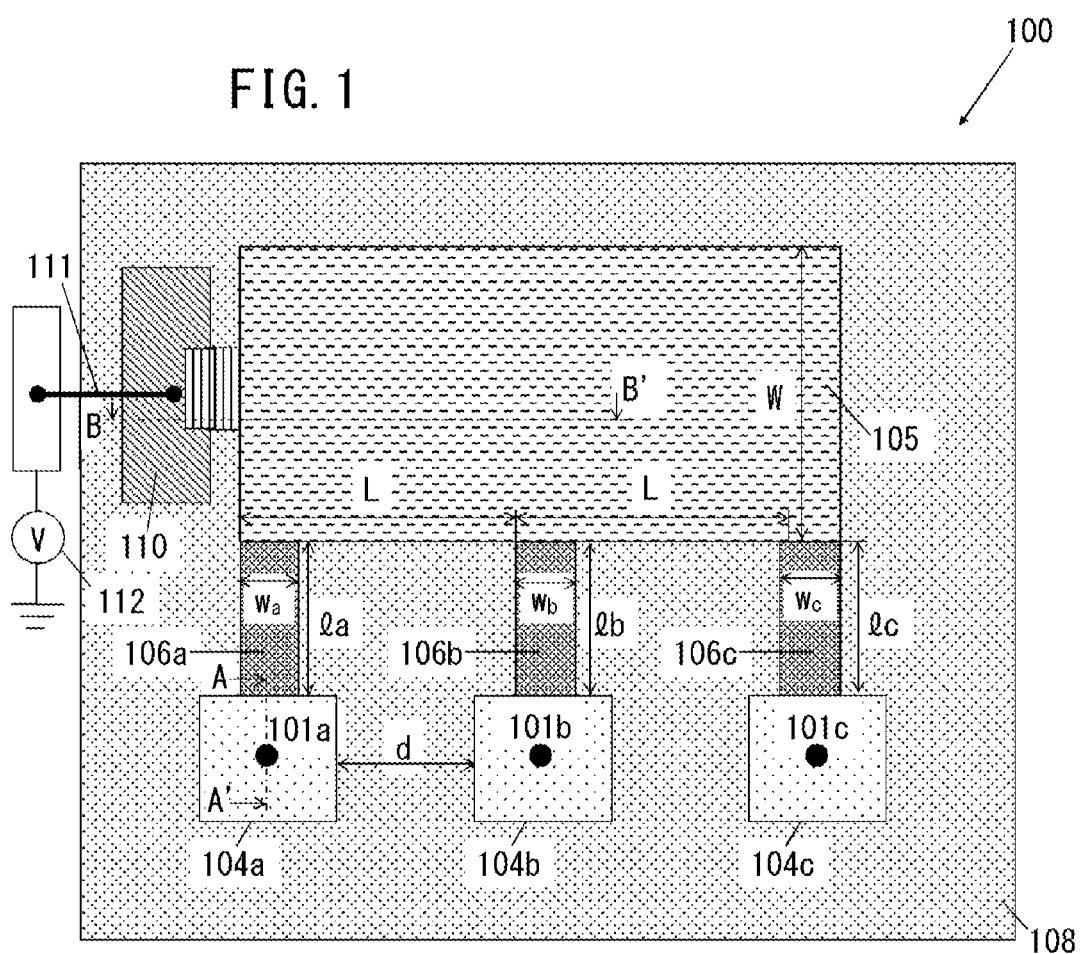
FIG. 1 is a top view schematically showing an example of an oscillating element according to the present embodiment.

Hereinafter, an embodiment of the present disclosure will be described with reference to the drawings. It is understood that the present disclosure is not limited to the embodiment described below and modifications may be appropriately made without departing from the spirit and scope of the disclosure. In addition, elements with the same function in the drawings described below may be denoted by same reference characters and a description thereof may be either omitted or simplified.

Figure 2:
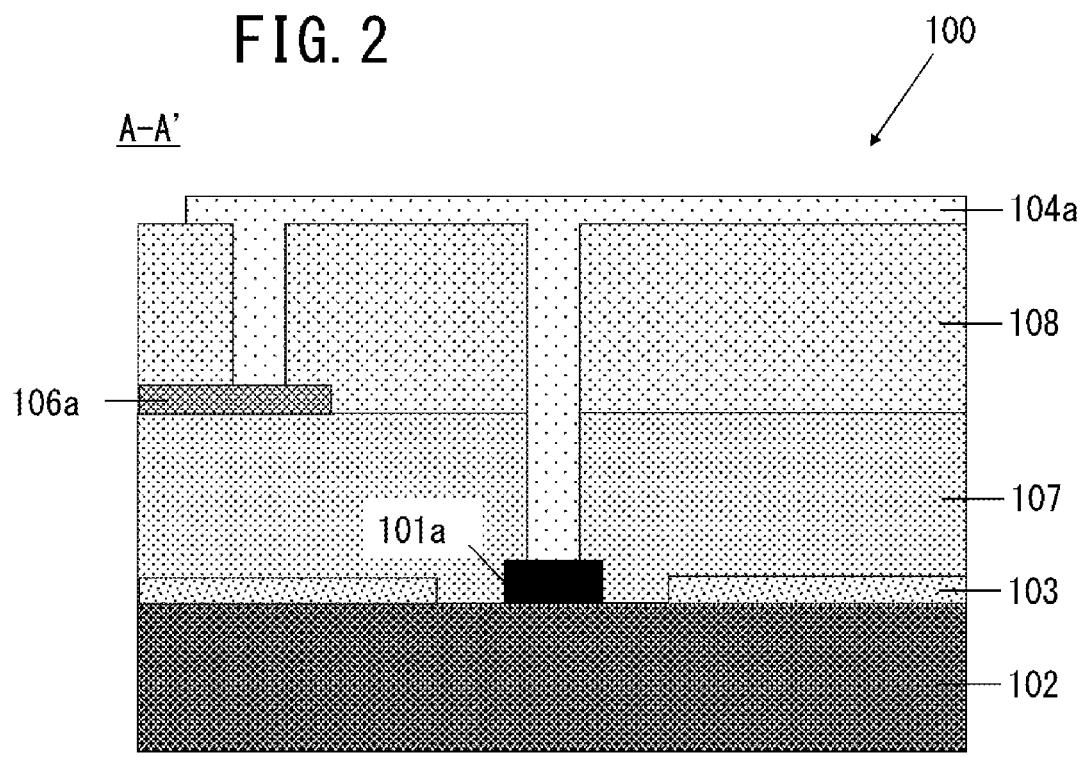
FIG. 2 is a sectional view taken along line A-A' in FIG. 1.
Figure 3:
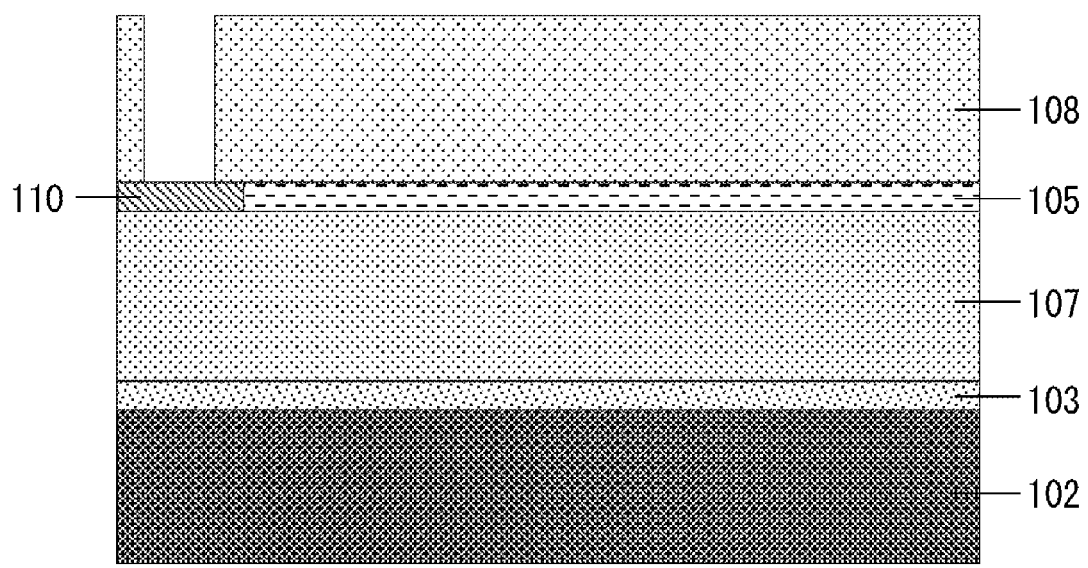
FIG. 3 is a sectional view taken along line B-B' in FIG. 1.

An oscillating element according to the present embodiment will be described with reference to FIGS. 1 to 3. FIG. 1 is a top view of the oscillating element, FIG. 2 is a sectional view taken along line A-A' in FIG. 1, and FIG. 3 is a sectional view taken along line B-B' in FIG. 1. It is understood that, in the description of respective examples presented below, a sectional structure of an oscillating element is similar to the structure shown in FIGS. 2 and 3 unless otherwise noted.

An oscillating element 100 according to the present embodiment has an antenna structure for transmitting or receiving an electromagnetic wave. As shown in FIGS. 2 and 3, the oscillating element 100 has a substrate 102, a ground metal (GND) 103, a negative resistance element 101a, a first insulator 107, and a second insulator 108. The oscillating element 100 further has antennas 104a to 104c for transmitting or receiving an electromagnetic wave and bias lines 105 and 106a to 106c. In the present embodiment, the plurality of antennas 104a to 104c are arranged in an array on the substrate 102. The antennas 104a to 104c are respectively electrically connected to a pad 110 via the bias line 105 (a wiring common to the antennas) and the bias lines 106a to 106c (individual wirings of the respective antennas). Furthermore, the pad 110 and a power supply 112 are connected via a wiring 111 including wire bonding.

The pad 110 is for establishing an electrical connection between a circuit outside of the oscillating element 100 and the antennas for the purpose of, for example, supplying a predetermined voltage from the outside. The pad 110 is constituted of a conductor. Hereinafter, the pad is for establishing an electrical connection with an external power supply source for supplying power to the antennas. More specifically, the pad is supplied a predetermined voltage from the outside and may also supply a predetermined voltage to the outside. In the present embodiment, the predetermined voltage may be a ground voltage, a power-supply voltage, or a voltage from a voltage bias circuit.

In the oscillating element 100, an InP substrate is used as the substrate 102, a plurality of negative resistance elements 101a to 101c as a semiconductor multilayer film that generates a terahertz wave is arranged on the substrate 102, and a gain in a terahertz wave frequency range can be obtained. For example, a resonant tunneling diode (RTD) or a Gunn diode can be adopted as the negative resistance elements 101a to 101c. In the following description, as an example, let us assume that the negative resistance elements 101a to 101c are constituted of RTDs.

The substrate 102 is connected by ohmic contact to the ground metal 103 to be a ground potential. The oscillating element 100 adopts a structure in which a cathode side is connected to the negative resistance elements 101a to 101c from the ground metal 103 via the substrate 102. In addition, a structure is adopted in which an anode side is connected to the antennas 104a to 104c from the bias lines 106a to 106c and the antennas 104a to 104c are connected to the negative resistance elements 101a to 101c. The antennas 104a to 104c are electrically connected on a one-to-one basis to the negative resistance elements 101a to 101c. Applying a bias voltage from the power supply 112 to the negative resistance elements 101a to 101c enables a terahertz wave oscillated by the negative resistance elements 101a to 101c and the antennas 104a to 104c to be resonators. In this case, a terahertz wave is an electromagnetic wave including a frequency component of 30 GHz to 30 THz.

As shown in FIG. 1, with respect to the antennas 104a to 104c, an antenna interval between adjacent antennas is assumed to be a distance d between ends of the antennas. The antenna interval d and directionality of the entire antenna array are known to correlate with each other. Setting the antenna interval d to an integral multiple of a wavelength or equal to or less than the wavelength of an oscillating electromagnetic wave or, favorably, equal to or less than half of the wavelength of the oscillating electromagnetic wave enables an electromagnetic wave-synthesizing effect in a far field to be obtained. Therefore, in the following description, the antenna interval d is assumed to be an integral multiple of the wavelength or equal to or less than the wavelength of an oscillated electromagnetic wave.

Figure 13A:
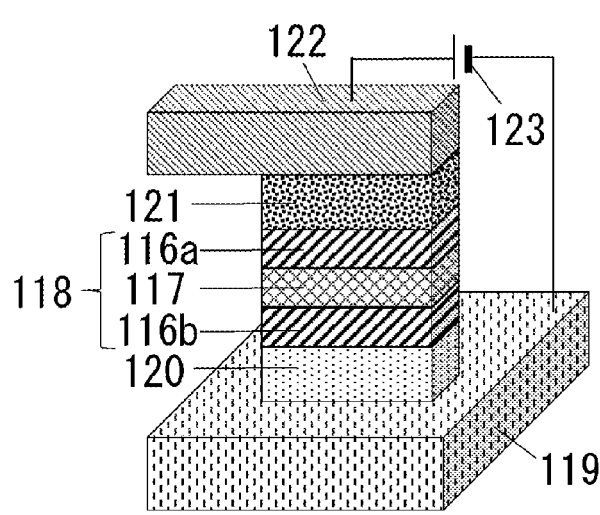
FIG. 13A is a diagram schematically showing a structure of an RTD of the oscillating element according to the present embodiment.
Figure 13B:
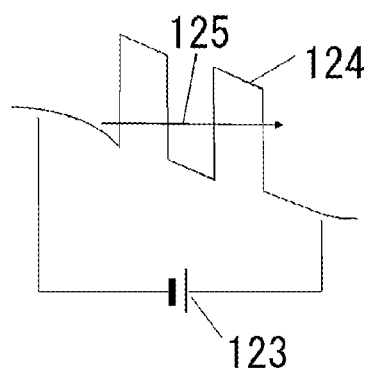
FIG. 13B is a graph conceptually showing a resonant tunneling effect of an energy barrier and an electron of the RTD during application of voltage.
Figure 13C:
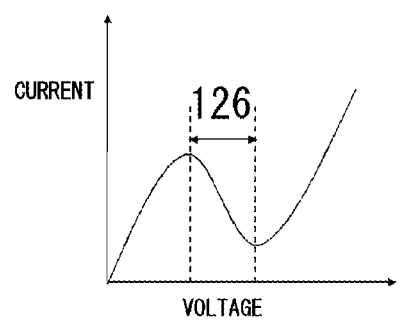
FIG. 13C is a graph showing an example of current-voltage characteristics of the RTD.

An oscillation principle and a drive voltage dependency of an oscillation frequency of an RTD oscillating element according to the present embodiment will be described. First, the oscillation principle will be explained with reference to FIGS. 13A to 13C. FIG. 13A is a diagram showing an example of a structure of an RTD that is used in the RTD oscillating element. FIG. 13B is a diagram for conceptually explaining a resonant tunneling effect of an energy barrier and an electron of the RTD during application of voltage. FIG. 13C is a diagram showing current-voltage characteristics of the RTD. As shown in FIG. 13A, an RTD 118 is constituted of a quantum well layer 117 and barrier layers 116a and 116b provided in contact with the quantum well layer 117 from above and below. A film thickness of the barrier layers 116a and 116b is assumed to be thinner than a film thickness of the quantum well layer 117.

A collector 121 and an electrode 122 are arranged on an upper layer of the RTD 118 and an emitter 120 and a ground 119 are arranged on a lower layer of the RTD 118. As shown in FIG. 13B, when a drive voltage is raised by a power supply 123, an electron level on a side of the emitter 120 eventually matches a resonance level of the quantum well layer 117 and an electron is transmitted through an energy barrier 124 as depicted by an arrow 125 due to a resonant tunneling effect. As a result, a current flows to a side of the collector 121. Further increasing the drive voltage causes the electron level on the side of the emitter 120 to exceed the resonance level, thereby preventing an electron from passing through the barrier layers 116a and 116b and reducing the current.

A region (voltage range) 126 shown in FIG. 13C represents a negative resistance region. Generally, while oscillation converges due to resistive loss in an LC oscillator circuit constituted of a coil and a capacitor, oscillation continues due to behavior that cancels out resistive loss in an LC oscillator circuit having negative resistance.

Next, the drive voltage dependency of an oscillation frequency will be described. If a capacitance of an RTD oscillating element including an antenna is denoted by C and an inductance of the antenna is denoted by $L_A$, then an oscillation frequency $f_0$ of the RTD is calculated according to expressions (1) and (2) below.

$$f_0 = \frac{1}{\left(2\pi\sqrt{CL_A}\right)} \quad (1)$$

$$C = C_A + C_0 + C_{RTD} \quad (2)$$

In this case, $C_A$ denotes a capacitance of the antenna. $C_0$ denotes a capacitance determined by permittivity and an area of the RTD 118 and a film thickness including the RTD 118, the emitter 120, and the collector 121. $C_{RTD}$ denotes a capacitance of the RTD 118 that is taken into consideration when applying voltage to the negative resistance region.

$L_A$ and $C_A$ are not dependent on drive voltage and a change in $C_0$ due to the drive voltage is negligibly small compared to a change in $C_{RTD}$ due to the drive voltage. Therefore, a drive voltage dependency of $C_{RTD}$ becomes dominant in the change to the oscillation frequency $f_0$ of RTD due to a change in the drive voltage. $C_{RTD}$ refers to a capacitance which is caused when an electron remains between the emitter 120 and the collector 121 during a delay time of the electron when voltage is being applied to the negative resistance region and which is determined by a quantum mechanical tunnel time ($t_{RTD}$) and a negative differential conductance (NDC) of the electron.

Since $t_{RTD}$ and NDC are both drive voltage-dependent, $C_{RTD}$ is dependent on the drive voltage and, consequently, the oscillation frequency $f_0$ has drive voltage dependency. In addition, $C_{RTD}$ is known to gradually increase in a vicinity of a voltage at which a current reaches a peak value and rapidly decrease as the voltage rises in the negative resistance region of the RTD. Accordingly, in the negative resistance region of the RTD, the oscillation frequency $f_0$ changes rapidly as the drive voltage changes. In such a principle, it is important that wiring resistances match each other and drive voltages match each other among antennas when creating an array.

Figure 14:
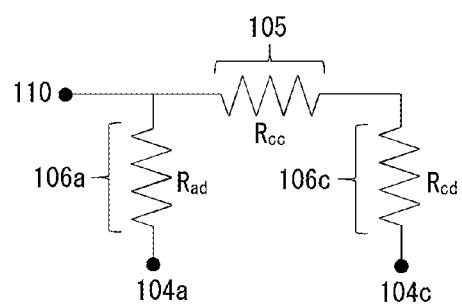
FIG. 14 shows an equivalent circuit of each wiring layer from a pad to an antenna in FIG. 1.

For example, letting $R_a$ denote a resistance value of a wiring from the pad 110 to the antenna 104a and $R_c$ denote a resistance value of a wiring from the pad 110 to the antenna 104c in FIG. 1, the resistance value $R_a$ and the resistance value $R_c$ are compared to each other. FIG. 14 shows an equivalent circuit of the wirings from the pad 110 to the antennas 104a and 104c. While the resistance value $R_a$ is solely determined by a resistance of the bias line 106a, the resistance value $R_c$ is determined by a series resistance of a resistance of the bias line 105 and a resistance of the bias line 106c. In FIG. 14, if the resistance value of the bias line 106a is denoted by $R_{ad}$, the resistance value of the bias line 105 is denoted by $R_{cc}$, and the resistance value of the bias line 106c is denoted by $R_{cd}$, then $R_a=R_{ad}$ and $R_c=R_{cc}+R_{cd}$ are satisfied.

Figure 15:
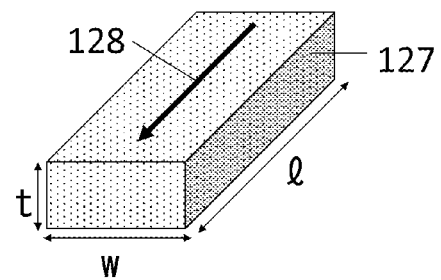
FIG. 15 is a diagram schematically showing a definition of dimensions of a resistance element.

In FIG. 1, resistivities and film thicknesses of the bias line 105 which is a wiring common to the plurality of antennas and the bias lines 106a to 106c which are individual wirings from the bias line 105 to the respective antennas are all equal to each other. In addition, widths $w_a$ to $w_c$ of the bias lines 106a to 106c are equal to each other and lengths $l_a$ to $l_c$ of the bias lines 106a to 106c are equal to each other. Generally, in a resistance element 127 shown in FIG. 15, a width w, a thickness t, and a length l of the resistance element 127 are defined relative to a direction 128 in which a current flows. In this case, a resistance value R of the resistance element 127 is represented by expression (3) below using resistivity p and a sectional area S=wt.

$$R = \frac{\rho l}{S} = \frac{\rho l}{wt} \quad (3)$$

Therefore, in FIG. 14, $R_{ad}=R_{cd}$ is satisfied and $R_a<R_c$ is also satisfied. Therefore, drive voltages differ between the antenna 104a and the antenna 104c. Assuming that the resistivity, the sectional area, and the length of the common wiring are all fixed values, matching $R_a$ and $R_c$ to each other requires relatively changing one of $R_{cd}$ and $R_{ad}$ with respect to the other so that $R_{cd}=R_{ad}-R_{cc}$ is satisfied. When the resistivity and the length are fixed values, the sectional area of the bias line 106c is increased relative to the sectional area of the bias line 106a. In this case, the sectional area of a bias line is determined by a product of film thickness and width. Therefore, when the film thickness is a fixed value, the width of the bias line 106c is increased relative to the width of the bias line 106a. In addition, when the width is a fixed value, the film thickness of the bias line 106c is increased relative to the film thickness of the bias line 106a. Furthermore, when the resistivity and the sectional area are fixed values, the length of the bias line 106a is increased relative to the length of the bias line 106c. Moreover, when the sectional area and the length are fixed values, the resistivity is effectively changed by constructing both of or one of the bias line 106a and the bias line 106c using a plurality of types of material.

As described above, in the present embodiment, at least one of resistivity ρ, sectional area S, and length l being parameters that determine a resistance value is set to different values between one antenna and other antennas in an antenna array. In other words, at least one of sectional areas, resistivities, and lengths of the respective wirings differ from each other in accordance with a position on the substrate of each antenna connected to each wiring so as to reduce a difference between wiring resistances of individual wirings which arises based on a distance between an antenna connected to each wiring and the pad.

Next, an example of forming steps of an oscillating element which are common to the respective examples described below will be explained with reference to FIGS. 16A to 16L. It should be noted that FIGS. 16A to 16F are sectional views taken along line A-A' in FIG. 1 of the oscillating element 100 in each step and FIGS. 16G to 16L are sectional views taken along line B-B' in FIG. 1 of the oscillating element 100 in each step.

Figure 16A:
FIGS. 16A to 16L are diagrams showing forming steps of the oscillating element according to the present embodiment.
Figure 16B:
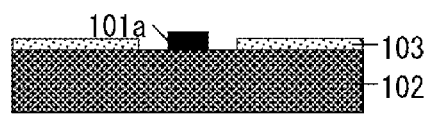
Figure 16C:
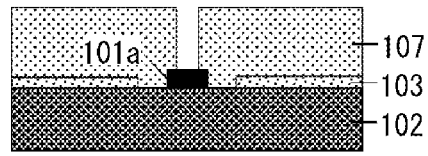
Figure 16D:
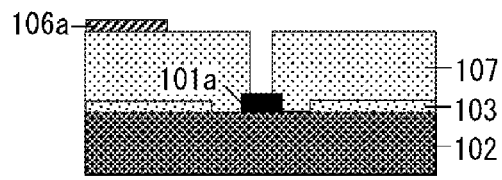
Figure 16E:
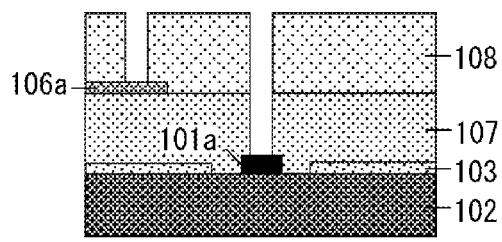
Figure 16F:
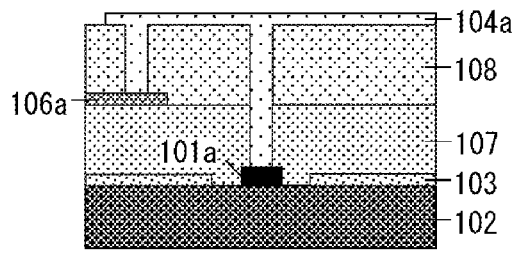
Figure 16G:
Figure 16H:
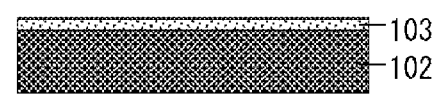
Figure 16I:
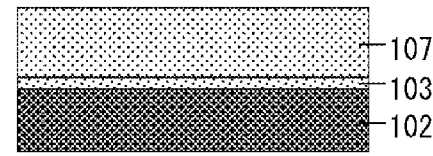
Figure 16J:
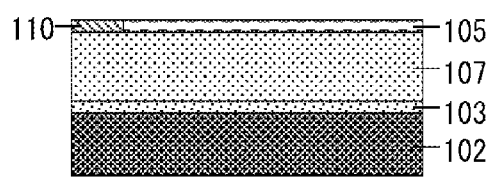
Figure 16K:
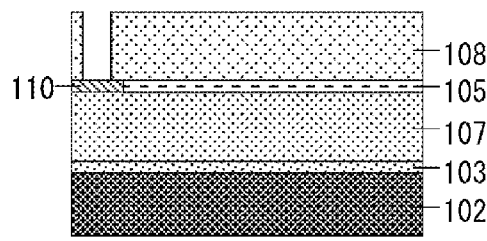
Figure 16L:
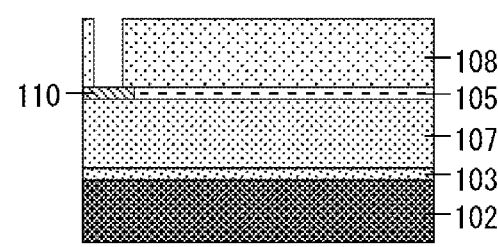

In FIGS. 16A and 16G, the negative resistance element 101a as a semiconductor multilayer film having been epitaxially grown on the substrate 102 are formed in a mesa shape by photolithography. In FIGS. 16B and 16H, the ground metal (GND) 103 is formed on the substrate 102 by photolithography. In FIGS. 16C and 16I, the first insulator 107 is formed on the substrate 102, the negative resistance element 101a, and the ground metal (GND) 103 and a first contact hole is formed by photolithography. In FIGS. 16D and 16J, the bias line 105 (a common wiring among antennas), the bias line 106a (an individual wiring for each antenna), and the pad 110 are formed by photolithography. In FIGS. 16E and 16K, the second insulator 108 is formed and a second contact hole is formed by photolithography. In FIGS. 16F and 16L, the antenna 104a is formed by photolithography. It should be noted that the antennas 104b and 104c are formed in a similar manner to the antenna 104a according to the steps described above.

This concludes the description of forming steps of an oscillating element which are common to the respective examples described below. Additional steps performed in each example will be explained in detail in the description of each example. Hereinafter, the examples will be described.

First Example

Figure 4:
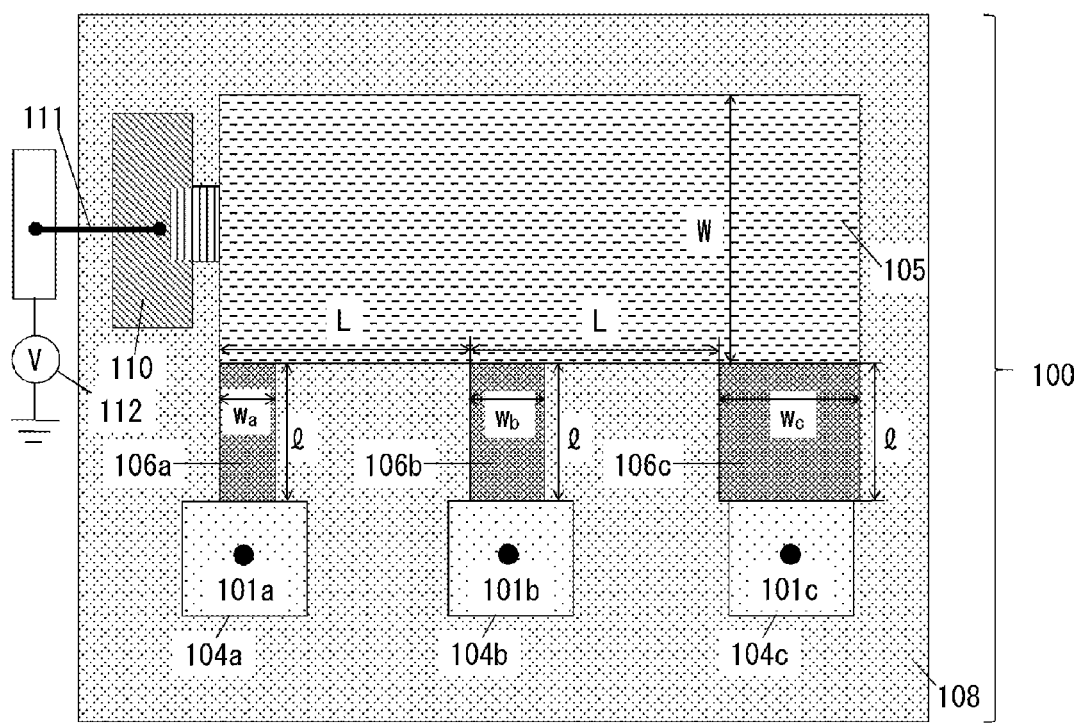
FIG. 4 is a top view schematically showing an example of an oscillating element according to a first example.

An oscillating element according to a first example will be described with reference to FIG. 4. FIG. 4 is a top view schematically showing an example of the oscillating element according to the first example. The oscillating element according to the present example is configured such that antennas are arranged in a 1 by 3 array on the second insulator 108 and power is fed to the respective antennas from one direction. As illustrated, wiring resistances from the pad 110 to the antennas 104a to 104c are matched with each other by respectively setting wiring widths $w_a$ to $w_c$ of the bias lines 106a to 106c to different widths. In addition, it is assumed that resistivities and film thicknesses of the bias line 105 which is a wiring common to the respective antennas and the bias lines 106a to 106c which are individual wirings from the bias line 105 to the respective antennas are all equal to each other.

In FIG. 4, let the wiring width and the wiring length of the bias line 105 be respectively denoted by W and L and the wiring length of the bias lines 106a to 106c be denoted by l. In the present example, the width $w_a$ of the bias line 106a is fixed while the width $w_b$ of the bias line 106b and the width $w_c$ of the bias line 106c are changed so that wiring resistances from the pad 110 to the antennas 104a to 104c match each other. More specifically, sectional areas of the bias lines 106a to 106c are set such that the closer the position on the substrate 102 of the antennas 104a to 104c respectively connected to the bias lines 106a to 106c to the pad 110, the smaller the sectional areas of the bias lines 106a to 106c. In the case of FIG. 4, the antennas 104b and 104a are arranged at positions closer to the pad 110 than the antenna 104c and the antenna 104a is arranged at a position closer to the pad 110 than the antenna 104b. Therefore, widths $w_a$, $w_b$, and $w_c$ of the bias lines 106a to 106c are set so as to satisfy $w_a < w_b < w_c$.

When the wiring resistances from the pad 110 to the antennas 104a to 104c match each other, with respect to the antenna 104b, a relationship between $w_b$ and $w_a$ is given by expression (4) below and a relationship between $w_c$ and $w_a$ is given by expression (5) below.

$$\frac{l}{w_b} = \frac{l}{w_a} - \frac{L}{W} \qquad (4)$$

$$\frac{l}{w_c} = \frac{l}{w_a} - \frac{2L}{W} \qquad (5)$$

In the present example, if L=500 µm, l=200 µm, W=600 µm, and $w_a$=80 µm are adopted as an example, then $w_b$=122 µm and $w_c$=240 µm are obtained.

Second Example

Figure 5:
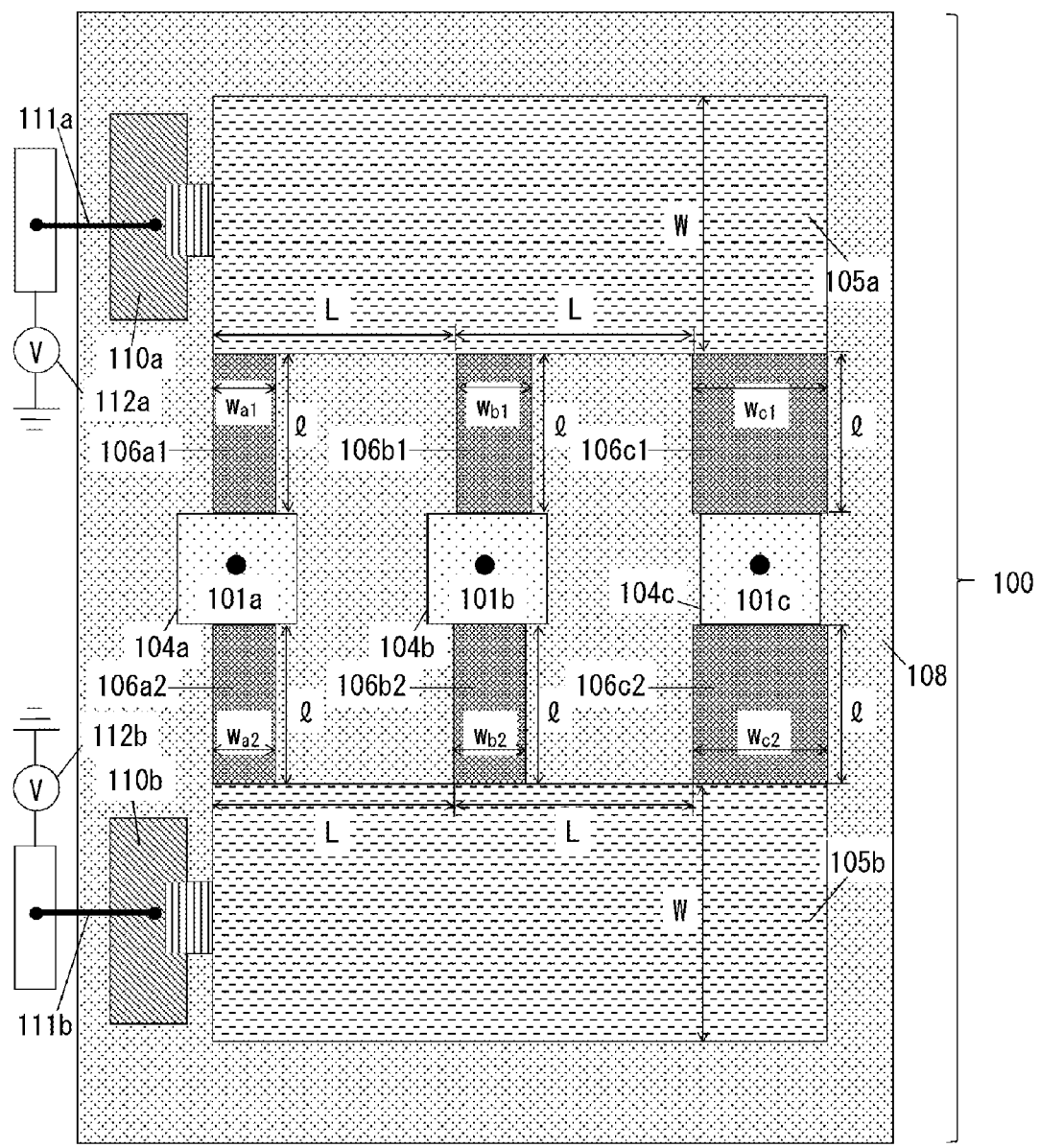
FIG. 5 is a top view schematically showing an example of an oscillating element according to a second example.

Next, an example of an oscillating element according to a second example will be described with reference to FIG. 5. FIG. 5 is a top view schematically showing an example of the oscillating element according to the second example.

In the present example, antennas are arranged in a 1 by 3 array on the second insulator 108 in a similar manner to the first example. The present example is configured such that power is fed to the respective antennas from two vertical directions on the second insulator 108. As illustrated, wiring widths $w_{a1}$ to $w_{c1}$ of bias lines 106a1 to 106c1 which are individual wirings of the respective antennas are set to widths that differ from each other. In a similar manner, wiring widths $w_{a2}$ to $w_{c2}$ of bias lines 106a2 to 106c2 which are individual wirings of the respective antennas are set to widths that differ from each other. Accordingly, wiring resistances from the pad 110 to the antennas 104a to 104c are matched with each other. In addition, resistivities and film thicknesses of the bias line 105 which is a wiring common to the respective antennas and the bias lines 106a to 106c which are individual wirings from the bias line 105 to the respective antennas are all equal to each other.

In FIG. 5, let the wiring width and the wiring length of the bias lines 105a and 105b be respectively denoted by W and L and the wiring length of the bias lines 106a1 to 106c2 be denoted by l. In the present example, since power is fed to the respective antennas from two vertical directions of the antennas on the second insulator 108, $w_{a1}=w_{a2}$, $w_{b1}=w_{b2}$, and $w_{c1}=w_{c2}$ are satisfied due to symmetry in a direction in which power is fed to the antennas. In addition, in the present example, $w_{a1}=w_{a2}$ is fixed while $w_{b1}$ (=$w_{b2}$) and $w_{c1}$ (=$w_{c2}$) are changed so that wiring resistances from the pad 110 to the antennas 104a to 104c match each other. More specifically, in a similar manner to the first example, sectional areas of the bias lines 106a1 to 106c1 are set such that the closer the position on the substrate 102 of the antennas 104a to 104c respectively connected to the bias lines 106a1 to 106c1 to the pad 110, the smaller the sectional areas of the bias lines 106a1 to 106c1. In addition, sectional areas of the bias lines 106a2 to 106c2 are set such that the closer the position on the substrate 102 of the antennas 104a to 104c respectively connected to the bias lines 106a2 to 106c2 to the pad 110, the smaller the sectional areas of the bias lines 106a2 to 106c2.

When the wiring resistances from the pad 110 to the antennas 104a to 104c match each other, with respect to the antenna 104b, a relationship between $w_{b1}$ and $w_{a1}$ is given by expression (6) below and a relationship between $w_{c1}$ and $w_{a1}$ is given by expression (7) below.

$$\frac{l}{w_{b1}} = \frac{l}{w_{a1}} - \frac{L}{W} \qquad (6)$$

$$\frac{l}{w_{c1}} = \frac{l}{w_{a1}} - \frac{2L}{W} \qquad (7)$$

In the present example, if L=500 µm, l=200 µm, W=600 µm, and $w_{a1}=w_{a2}$=80 µm are adopted as an example, then $w_{b1}=w_{b2}$=122 µm and $w_{c1}=w_{c2}$=240 µm are obtained.

Therefore, with the oscillating element according to the second example, the wiring resistances of the respective antennas can be matched with each other even when directions in which power is fed to the antennas are increased as compared to the first example. Although the directions in which power is fed to the respective antennas are vertical directions in the present example, the power supply direction is not limited to vertical directions.

Third Example

Figure 6:
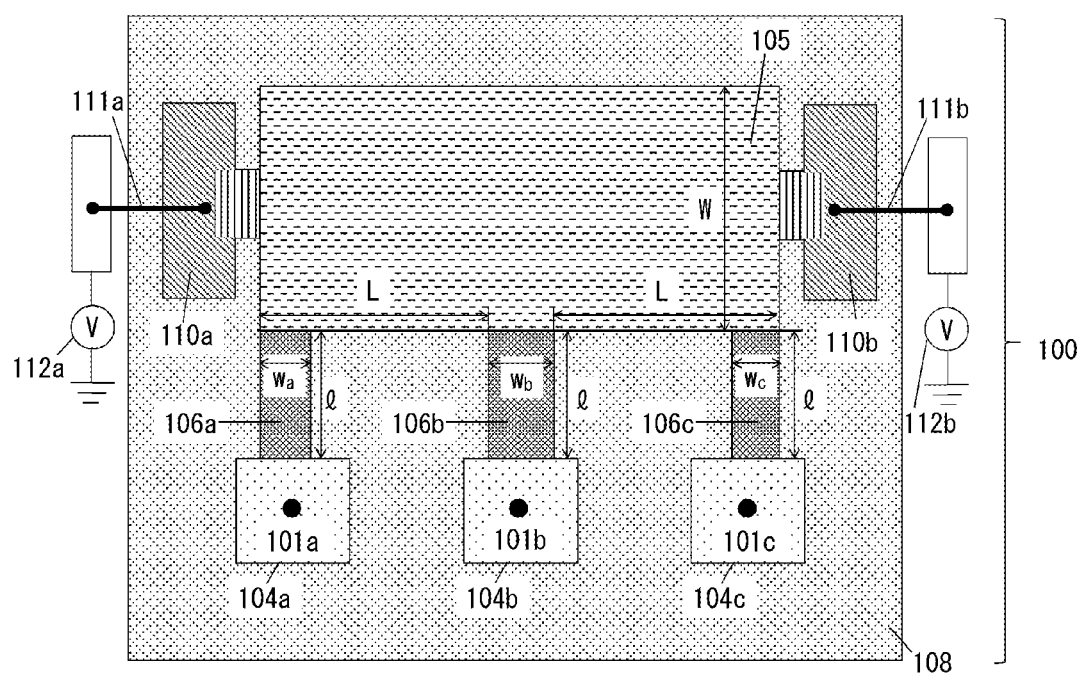
FIG. 6 is a top view schematically showing an example of an oscillating element according to a third example.

Next, an example of an oscillating element according to a third example will be described with reference to FIG. 6. FIG. 6 is a top view schematically showing an example of the oscillating element according to the third example.

In the present example, antennas are arranged in a 1 by 3 array on the second insulator 108 in a similar manner to the first and second examples. In the present example, pads are arranged in plurality on the substrate 102. In addition, on the second insulator 108, power is fed to the bias line 105 from two left-right directions of the bias line 105 via pads 110a and 110b. Furthermore, wiring widths $w_a$ to $w_c$ of the bias lines 106a to 106c are set to widths in accordance with wiring lengths from the pad 110a or the pad 110b to the antennas 104a to 104c. Accordingly, wiring resistances from the pads 110a and 110b to the antennas 104a to 104c are matched with each other. In this case, $w_a=w_c$ is satisfied due to symmetry in a direction in which power is fed to the bias line 105. In addition, it is assumed that resistivities and film thicknesses of the bias line 105 which is a wiring common to the respective antennas and the bias lines 106a to 106c which are individual wirings from the bias line 105 to the respective antennas are all equal to each other.

In FIG. 6, let the wiring width and the wiring length of the bias line 105 be respectively denoted by W and L and the wiring length of the bias lines 106a to 106c be denoted by l. In the present example, the width $w_a(=w_c)$ is fixed while $w_b$ is changed so that wiring resistances from the pads 110a and 110b to the antennas 104a to 104c match each other.

Let a synthesized wiring resistance from the pads 110a and 110b to the antenna 104a be denoted by $R_a$ and a synthesized wiring resistance from the pads 110a and 110b to the antenna 104b be denoted by $R_b$. In addition, if resistivity of the bias line 105 and the bias lines 106a to 106c is denoted by ρ and a film thickness thereof is denoted by t, then expressions (8) and (9) below are satisfied.

$$\frac{1}{R_a} = \frac{1}{\left(\frac{\rho l}{w_a t}\right)} + \frac{1}{\left(\frac{\rho(2L + w_b - w_a)}{Wt}\right) + \left(\frac{\rho l}{w_a t}\right)} \quad (8)$$

$$\frac{1}{R_b} = \frac{2}{\left(\frac{\rho l}{w_b t}\right) + \left(\frac{\rho L}{Wt}\right)} \quad (9)$$

In the present example, if L=500 μm, l=200 μm, W=600 μm, and $w_a=w_c=60$ μm are adopted as an example, then $w_b=62$ μm is obtained when $R_a=R_b$ is satisfied.

In the third example, at least one of sectional areas, resistivities, and lengths of the respective wirings differ from each other in accordance with a position on the substrate of each antenna connected to each wiring so as to reduce a difference between synthesized wiring resistances from a plurality of pads to the respective antennas. Therefore, with the oscillating element according to the third example, the wiring resistances of the respective antennas can be matched with each other even when the number of pads that supply power to the bias line 105 is changed as shown in FIG. 6.

Fourth Example

Figure 7:
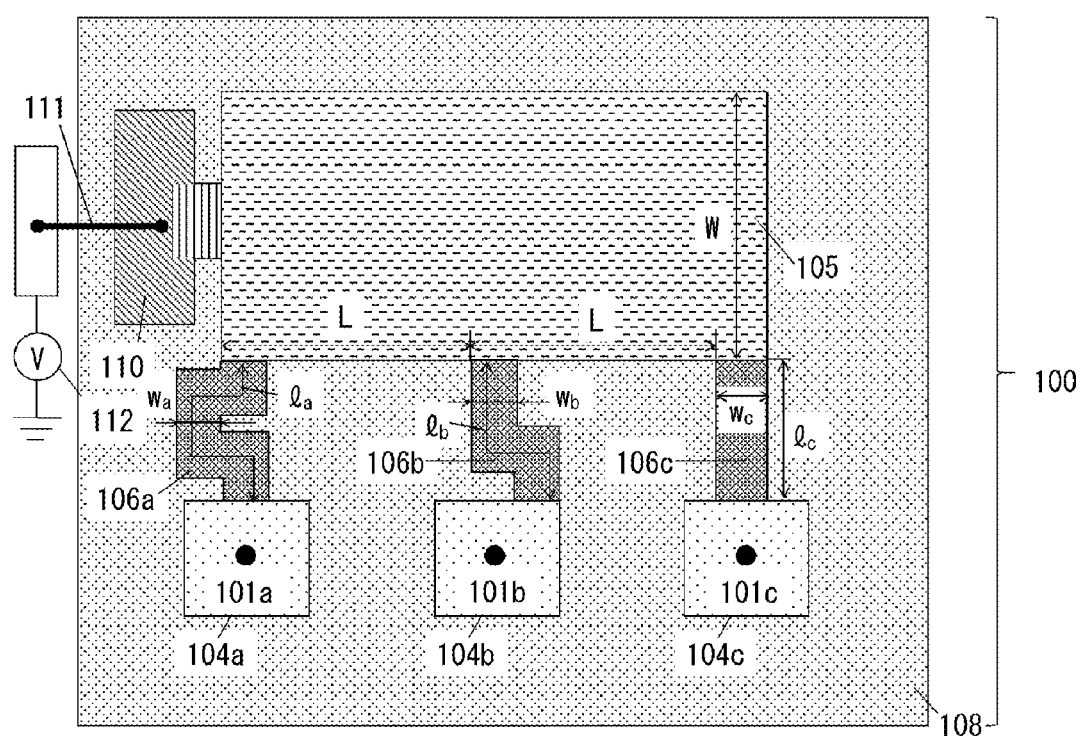
FIG. 7 is a top view schematically showing an example of an oscillating element according to a fourth example.

Next, an example of an oscillating element according to a fourth example will be described with reference to FIG. 7. FIG. 7 is a top view schematically showing an example of the oscillating element according to the fourth example.

In the present example, antennas are arranged in a 1 by 3 array on the second insulator 108 in a similar manner to the first to third examples. The present example is configured such that power is fed to the antennas 104a to 104c from one direction on the second insulator 108. In addition, the wiring lengths $l_a$ to $l_c$ of the bias lines 106a to 106c are respectively set to different wiring lengths. Accordingly, wiring resistances from the pad 110 to the antennas 104a to 104c are matched with each other. In addition, it is assumed that resistivities and film thicknesses of the bias line 105 which is a wiring common to the respective antennas and the bias lines 106a to 106c which are individual wirings from the bias line 105 to the respective antennas are all equal to each other.

In FIG. 7, let the wiring width and the wiring length of the bias line 105 be respectively denoted by W and L and the wiring widths of the bias lines 106a to 106c be denoted by $w_a=w_b=w_c$. In the present example, $l_c$ is fixed while $l_a$ and $l_b$ are changed so that wiring resistances from the pad 110 to the antennas 104a to 104c match each other. When the wiring resistances from the pad 110 to the antennas 104a to 104c match each other, with respect to the antenna 104a, a relationship between $l_a$ and $l_c$ is given by expression (10) below and a relationship between $l_b$ and $l_c$ is given by expression (11) below.

$$\frac{l_a}{w_a} = \frac{l_c}{w_c} + \frac{2L}{W} \quad (10)$$

$$\frac{l_b}{w_b} = \frac{l_c}{w_c} + \frac{L}{W} \quad (11)$$

In the present example, if L=500 μm, W=600 μm, $w_a=w_b=w_c=80$ μm, and $l_c=200$ μm are adopted as an example, then $l_a=333$ μm and $l_b=267$ μm are obtained.

Therefore, with the oscillating element according to the fourth example, the wiring resistances of the respective antennas can be matched with each other even when wiring widths and wiring lengths of wiring connected to the antennas are changed as compared to the first example.

Fifth Example

Figure 8:
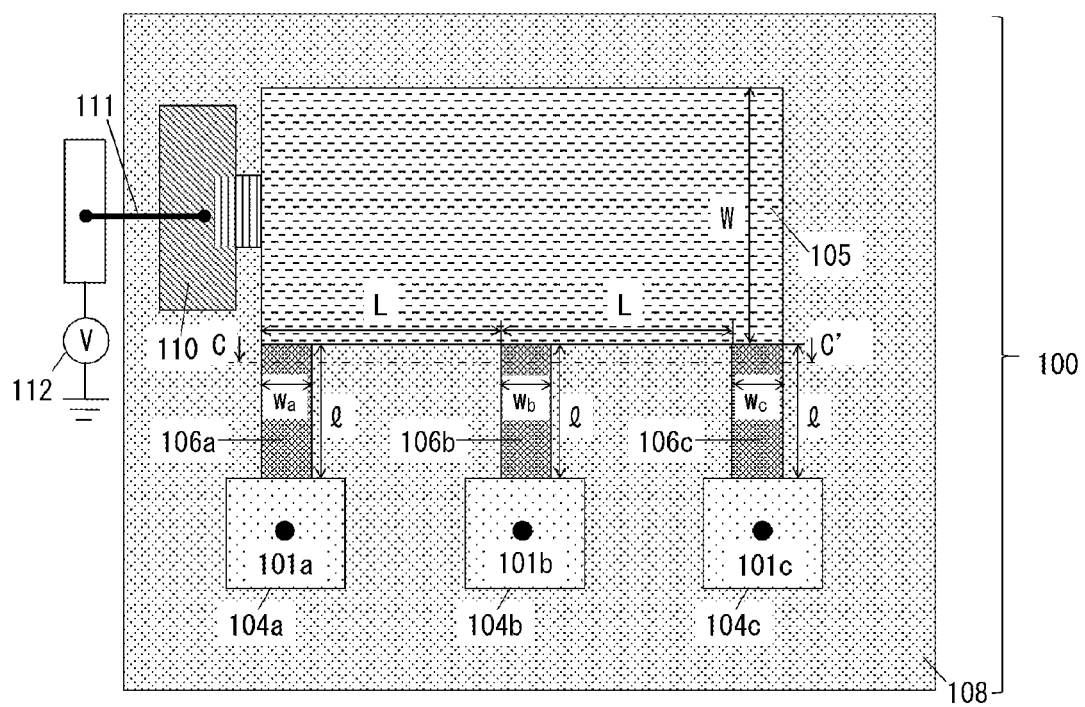
FIG. 8 is a top view schematically showing an example of an oscillating element according to a fifth example.
Figure 9:
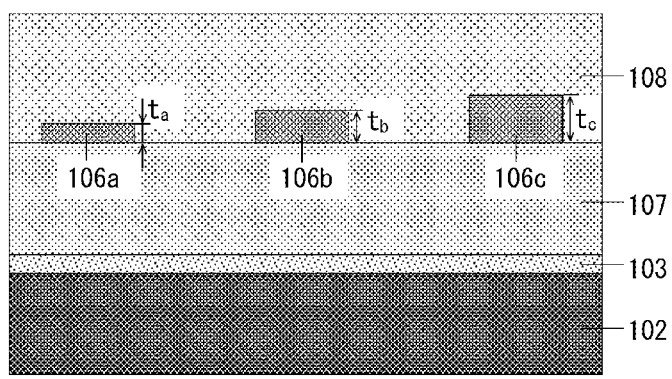
FIG. 9 is a sectional view taken along line C-C' in FIG. 8.

Next, an example of an oscillating element according to a fifth example will be described with reference to FIGS. 8 and 9. FIG. 8 is a top view schematically showing an example of the oscillating element according to the fifth example. In addition, FIG. 9 is a sectional view taken along line C-C' in FIG. 8.

In the present example, antennas are arranged in a 1 by 3 array on the second insulator 108 in a similar manner to the first to fourth examples. The present example is configured such that power is fed to the antennas 104a to 104c from one direction on the second insulator 108. In addition, the film thicknesses $t_a$ to $t_c$ of the bias lines 106a to 106c are respectively set to different film thicknesses. Accordingly, wiring resistances from the pad 110 to the antennas 104a to 104c are matched with each other. In addition, it is assumed that resistivities of the bias line 105 which is a wiring common to the respective antennas and the bias lines 106a to 106c which are individual wirings from the bias line 105 to the respective antennas are equal to each other.

In FIG. 8, let the wiring width and the wiring length of the bias line 105 be respectively denoted by W and L and the wiring widths of the bias lines 106a to 106c be denoted by $w_a=w_b=w_c$. In addition, let the film thickness of the bias line 105 be denoted by T. In the present example, the film thickness $t_a$ of the bias line 106a is fixed while the film thickness $t_b$ of the bias line 106b and the film thickness $t_c$ of the bias line 106c are changed so that wiring resistances from the pad 110 to the antennas 104a to 104c match each other. In the present example, wiring resistances from the pad 110 to the antennas 104a to 104c are matched each other by setting sectional areas of the bias lines 106a to 106c such that the closer the position of the antennas 104a to 104c to the pad 110, the smaller the sectional areas of the bias lines 106a to 106c. When the wiring resistances from the pad 110 to the antennas 104a to 104c match each other, with respect to the antenna 104b, a relationship between $t_b$ and $t_a$ is given by expression (12) below and, with respect to the antenna 104c, a relationship between $t_c$ and $t_a$ is given by expression (13) below.

$$\frac{l}{w_b t_b} = \frac{l}{w_a t_a} - \frac{L}{WT} \quad (12)$$

$$\frac{l}{w_c t_c} = \frac{l}{w_a t_a} - \frac{2L}{WT} \quad (13)$$

In the present example, if L=500 μm, l=200 μm, W=600 μm, $w_a=w_b=w_c=80$ μm, and $t_a=T=500$ nm are adopted as an example, then $t_b=750$ nm and $t_c=1500$ nm are obtained.

Therefore, with the oscillating element according to the fifth example, the wiring resistances among the antennas can be matched with each other even when film thicknesses of wirings connected to the antennas are changed as compared to the first example.

Sixth Example

Figure 10:
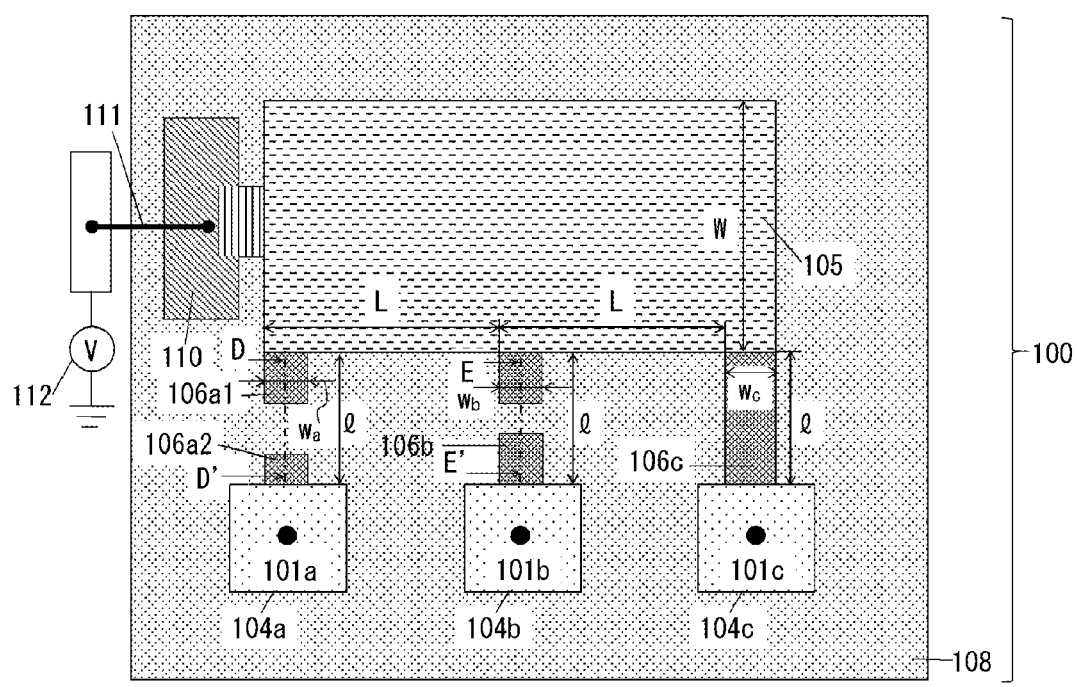
FIG. 10 is a top view schematically showing an example of an oscillating element according to a sixth example.

Next, an example of an oscillating element according to a sixth example will be described with reference to FIGS. 10, 11A, and 11B. FIG. 10 is a top view schematically showing an example of the oscillating element according to the sixth example. In addition, FIG. 11A is a sectional view taken along line D-D' in FIG. 10 and FIG. 11B is a sectional view taken along line B-B' in FIG. 10.

In the present example, antennas are arranged in a 1 by 3 array on the second insulator 108 in a similar manner to the first to fifth examples. The present example is configured such that power is fed to the antennas 104a to 104c from one direction on the second insulator 108. In addition, bias lines from the bias line 105 to the antennas 104a and 104b are constructed using a plurality of materials.

Figure 11A:
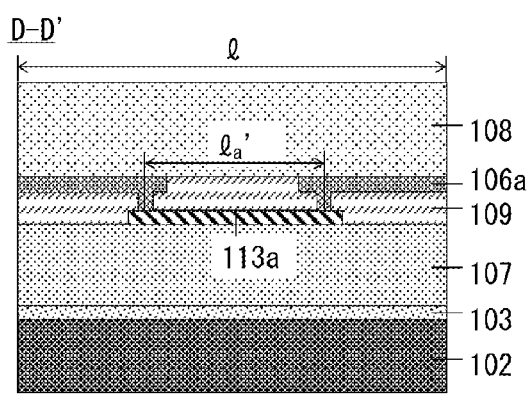
FIG. 11A is a sectional view taken along line D-D' in FIG. 10

Specifically, as shown in FIG. 11A, the bias line 106a is constituted of bias lines 106a1 and 106a2 and a bias line 113a connected to the bias lines 106a1 and 106a2. In addition, as shown in FIG. 11B, the bias line 106b is constituted of bias lines 106b1 and 106b2 and a bias line 113b connected to the bias lines 106b1 and 106b2. Furthermore, a material (a first material) constituting the bias lines 106a1 and 106a2 differs from a material (a second material) constituting the bias line 113a. In a similar manner, a material (a first material) constituting the bias lines 106b1 and 106b2 differs from a material (a second material) constituting the bias line 113b. In addition, lengths of the bias lines 106a to 106c and 113a to 113c are set in accordance with positions of the antennas 104a to 104c with respect to the pad 110. Accordingly, wiring resistances from the pad 110 to the antennas 104a to 104c are matched with each other.

Figure 11B:
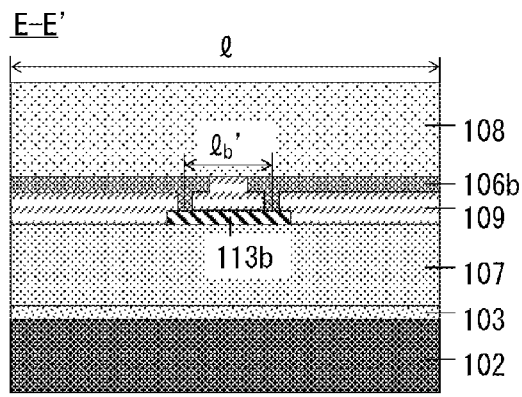
FIG. 11B is a sectional view taken along line B-B' in FIG. 10.

As shown in FIGS. 10, 11A, and 11B, in a top view of the second insulator 108 (the substrate 102 and the antennas 104a to 104c), let lengths of the bias lines 106a1, 106a2, and 113a from the bias line 105 to the antenna 104a be denoted by l. In a similar manner, let lengths of the bias lines 106b1, 106b2, and 113b from the bias line 105 to the antenna 104b be also denoted by l. In addition, let lengths of the bias lines 113a to 113b be respectively denoted by $l_a'$ and $l_b'$.

Furthermore, a third insulator 109 has been added on the substrate 102 as a constituent element of the oscillating element and, as shown in FIG. 11A, the bias lines 106a1 and 106a2 and the bias line 113a are electrically connected via a contact hole provided in the third insulator 109. In a similar manner, as shown in FIG. 11B, the bias lines 106b1 and 106b2 and the bias line 113b are electrically connected via a contact hole provided in the third insulator 109. In the present example, on the substrate 102, the bias lines 106a1 and 106a2 are formed using the first material as a first wiring of a first layer and the bias line 113a is formed using the second material as a second wiring of a second layer. In addition, the bias lines 106b1 and 106b2 and the bias line 113b are formed in a similar manner.

Furthermore, film thicknesses of the bias line 105 which is a wiring common to the respective antennas and the bias lines 106a1 to 106c and 113a to 113c which are individual wirings from the bias line 105 to the respective antennas are all equal to each other.

In FIG. 10, let the wiring width and the length of the bias line 105 be respectively denoted by W and L and the wiring widths of the bias lines 106a1 to 106c be denoted by $w_a=w_b=w_c$. It should be noted that the wiring width of the bias lines 106a1 and 106a2 is denoted by $w_a$ and the wiring width of the bias lines 106b1 and 106b2 is denoted by $w_b$. Let resistivity of the bias lines 106a1 to 106c be denoted by $\rho_1$, resistivity of the bias lines 113a to 113c be denoted by $\rho_2$, and wiring resistances from the pad 110 to the antennas 104a to 104c be respectively denoted by $R_a$, $R_b$, and $R_c$. In this case, expression (14) is satisfied when $R_a=R_c$ is true and expression (15) is satisfied when $R_b=R_c$ is true.

$$\frac{\rho_1(l-l_a')}{w_a} + \frac{\rho_2 l_a'}{w_a} = \frac{\rho_1 l}{w_c} + \frac{2\rho_1 L}{W} \quad (14)$$

$$\frac{\rho_1(l-l_b')}{w_b} + \frac{\rho_2 l_b'}{w_b} = \frac{\rho_1 l}{w_c} + \frac{\rho_1 L}{W} \quad (15)$$

In the present example, if $\rho_1=4.1\times10^{-8}$ Ωm, $\rho_2=1.15\times10^{-7}$ Ωm, L=500 μm, W=600 μm, $w_a=w_b=w_c=130$ μm, and l=200 μm are adopted as an example, then $l_a'=120$ μm and $l_b'=60$ μm are obtained.

Therefore, with the oscillating element according to the sixth example, the wiring resistances among the antennas can be matched with each other even when the bias lines are constructed using a plurality of types of materials as compared to the first example. In addition, by configuring the bias lines so as to have a plurality of layers as in the oscillating element according to the sixth example, an increase in the degree of freedom of arrangement of constituent elements on the substrate can be expected.

Seventh Example

Figure 12:
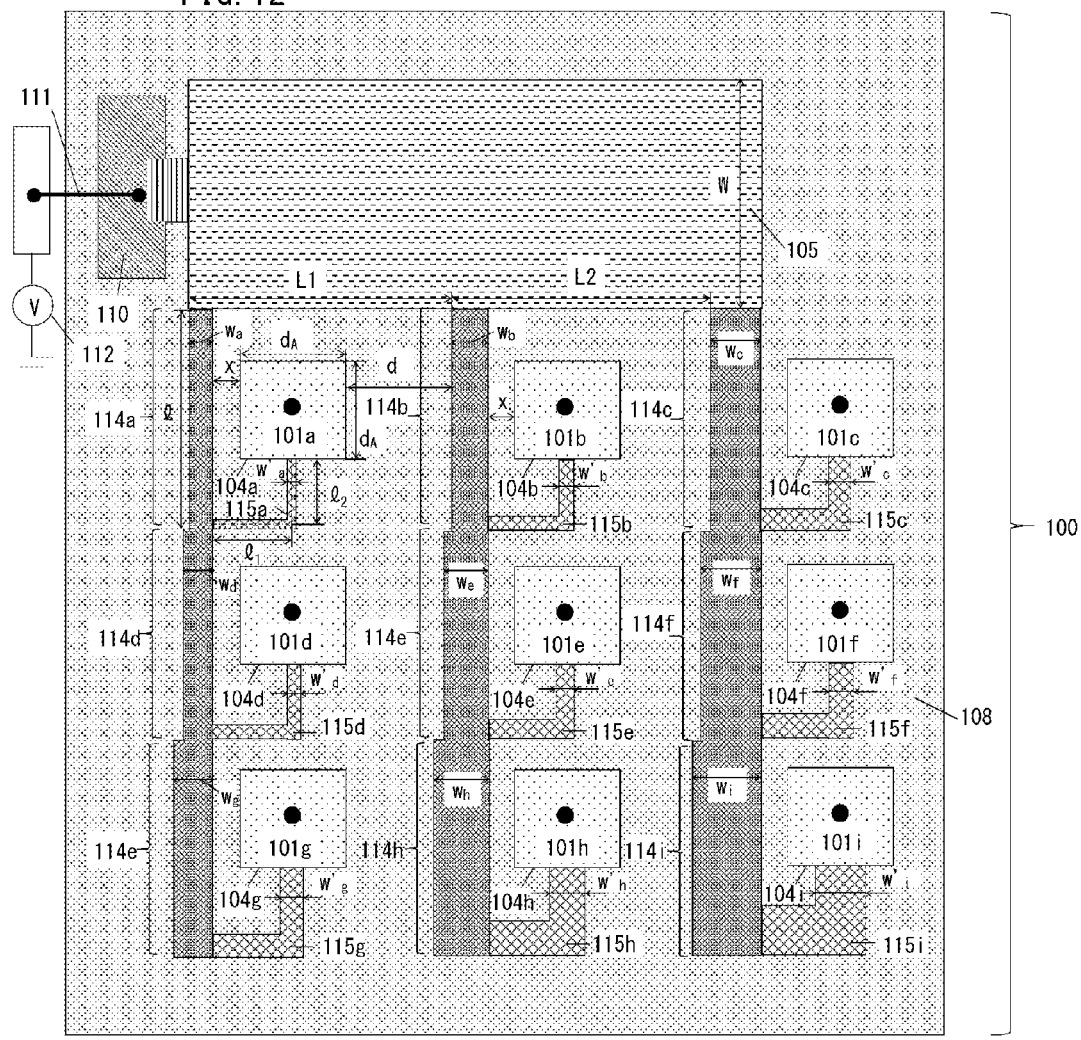
FIG. 12 is a top view schematically showing an example of an oscillating element according to a seventh example.

Next, an example of an oscillating element according to a seventh example will be described with reference to FIG. 12. FIG. 12 is a top view schematically showing an example of the oscillating element according to the seventh example.

While antennas are arranged in a one-dimensional array on the second insulator 108 in the first to sixth examples, in the present example, antennas are arranged in a two-dimensional 3 by 3 array on the second insulator 108. In addition, the second insulator 108 is configured such that power is fed to the antennas 104a to 104i from one direction (from below the plane of paper in the illustrated example).

In the present example, on the second insulator 108, a bias line to act as a wiring from the bias line 105 to the respective antennas is divided into segments 114a to 114i and segments 115a to 115i which extend in a longitudinal direction. The segments 115a to 115i extend in a transverse direction from the segments 114a to 114i and connect to the antennas 104a to 104i. In this case, the longitudinal direction that is the direction in which the segments 114a to 114i extend is assumed to be a direction in which the antenna 104d and the antenna 104g are arranged with the antenna 104a as a reference in FIG. 12 (an up-down direction of the plane of paper in the illustrated example). In addition, the transverse direction is assumed to be a direction in which the antenna 104b and the antenna 104c are arranged with the antenna 104a as a reference in FIG. 12 (a left-right direction of the paper plane in the illustrated example).

Wiring widths of the segments 114a to 114i are set such that the farther a segment is from the pad 110, the wider the wiring width of the segment. In a similar manner, wiring widths of the segments 115a to 115i are also set such that the farther a segment is from the pad 110, the wider the wiring width of the segment. As shown in the diagram, let the wiring widths of the segments 114a to 114i be respectively denoted by Wa to Wi. In this case, in the longitudinal direction, Wa, Wd, and Wg have a relationship expressed as Wa<Wd<Wg, Wb, We, and Wh have a relationship expressed as Wb<We<Wh, and Wc, Wf, and Wi have a relationship expressed as Wc<Wf<Wi. In addition, in the transverse direction, Wa, Wb, and Wc have a relationship expressed as Wa<Wb<Wc, Wd, We, and Wf have a relationship expressed as Wd<We<Wf, and Wg, Wh, and Wi have a relationship expressed as Wg<Wh<Wi. In a similar manner, as shown in the diagram, let the wiring widths of the segments 115a to 115i be respectively denoted by W'a to W'i. In this case, in the longitudinal direction, W'a, W'd, and W'g have a relationship expressed as W'a<W'd<W'g, W'b, We, and W'h have a relationship expressed as W'b<We<W'h, and W'c, W'f, and W'i have a relationship expressed as W'c<W'f<W'i. In addition, in the transverse direction, W'a, W'b, and W'c have a relationship expressed as W'a<W'b<W'c, W'd, We, and W'f have a relationship expressed as W'd<W'e<W'f, and W'g, W'h, and W'i have a relationship expressed as W'g<W'h<W'i. Moreover, it is assumed that resistivities and film thicknesses of the bias line 105 which is a wiring common to the respective antennas and the segments 114a to 114i and the segments 115a to 115i of the bias lines which are individual wirings from the bias line 105 to the respective antennas are all equal to each other.

In the present example, unlike the first to sixth examples, the bias lines which are individual wirings from the bias line 105 to the respective antennas are divided into two regions of the segments 114a to 114i and the segments 115a to 115i. In this case, the segments 114a to 114i constitute a first segment to be a wiring of at least two antennas among the plurality of antennas. In addition, the segments 115a to 115i constitute a second segment electrically connected to each of at least two antennas from the first segment. Let us focus on the antennas 104a, 104b, and 104c in a case where the antennas are arranged in a two-dimensional array as shown in FIG. 12. In FIG. 12, let resistance values of wirings from the pad 110 to the segments 115a, 115b, and 115c of each antenna be denoted by $R_a$, $R_b$, and $R_c$. In this case, wiring widths $w_a$, $w_b$, and $w_c$ of the segments 114a, 114b, and 114c are respectively determined so as to satisfy $R_a=R_b=R_c$.

Furthermore, let us focus on the antennas 104a and 104d as an example. In FIG. 12, let a resistance value of a wiring from the pad 110 to the segment 115d of the antenna 104d be denoted by $R_d$. In addition, let a resistance value of the segment 114a be denoted by $R_{ad}$ and a resistance value of the segment 114d be denoted by $R_{dd}$. In this case, since a wiring from the pad 110 to the segment 115a is common, $R_a < R_d$ is satisfied. In addition, in the present example, widths $w'_a$ and $w'_d$ of the segment 115a and the segment 115d are determined so that the resistance value of the wiring from the pad 110 to the antenna 104a matches the resistance value of the wiring from the bias line 105 to the antenna 104d. Furthermore, widths $w'_d$ and $w'_g$ of the segment 115d and the segment 115g are determined so that resistance values of the wirings from the pad 110 to the respective antennas match each other even between the antennas 104d and 104g. In a similar manner, widths $w'_e$, $w'_h$, $w'_f$, and $w'_i$ of the respective segments are determined so that resistance values of the wirings from the pad 110 to the respective antennas match each other even among the antennas 104b, 104e, and 104h and among the antennas 104c, 104f, and 104i. Accordingly, in the present example, wiring resistances from the pad 110 to the respective antennas 104a to 104i can be matched with each other by adjusting widths of the segments 114a to 114i and the segments 115a to 115i of the bias lines.

In this case, let a resistance value of a wiring from the pad 110 to an antenna 104x (x=a to i) be denoted by $R_x$ (x=a to i). In addition, let a wiring width of a segment 114x (x=a to i) be denoted by $w_x$ (x=a to i), a wiring width of a segment 115x (x=a to i) be denoted by $w'_x$ (x=a to i), and a wiring width of the bias line 105 be denoted by W. Wiring lengths of the segments 114a to 114i are all assumed to be the same wiring length l=400 μm. In addition, wiring lengths of the segments 115a to 115i are also all assumed to be the same wiring length l'=130 ∞m. It should be noted that, using $l_1$ and $l_2$ as shown in FIG. 12, the wiring length l' is expressed as $l'=l_1+l_2$.

In FIG. 12, let the wiring widths of the segments 114a, 115a, 115b, and 115c and the bias line 105 be denoted by $w_a=100$ μm, $w'_a=20$ μm, $w'_b=22$ μm, $w'_c=24$ μm, and W=600 μm.

As shown in FIG. 12, let a distance from a contact point on a side of the pad 110 of the bias line 105 and the segment 114a to a contact point on a side of the pad 110 of the bias line 105 and the segment 114b on the bias line 105 be denoted by L1. In addition, let a distance from a contact point on the side of the pad 110 of the bias line 105 and the segment 114b to a contact point on a side of the pad 110 of the bias line 105 and the segment 114c on the bias line 105 be denoted by L2. Furthermore, a distance x between each of the segments 114a to 114i and each antenna are equal for all antennas and x=10 μm. In the present example, a side $d_A$ of each antenna that is a square and an antenna interval d are made constant for each antenna. Therefore, L1 satisfies a relationship with $d_A$, d, $w_a$, and $w_b$, which is expressed as $L1=d_A+d+w_a-w_b$, and L2 satisfies a relationship with $d_A$, d, $w_b$, and $w_c$ which is expressed as $L2=d_A+d+w_b-w_c$. In addition, in the present example, it is assumed that $d_A=170$ μm and d=300 μm.

First, by having the antenna 104a and the antenna 104b satisfy expression (16) below and having the antenna 104b and the antenna 104c satisfy expression (17) below, wiring resistances are matched with each other among the antennas 104a, 104b, and 104c. From expression (16) and expression (17), $w_b=105$ μm and $w_c=113$ μm are obtained.

$$\frac{l}{w_a} + \frac{l'}{w'_a} = \frac{(w_a + d_a + d - w_b)}{W} + \frac{l}{w_b} + \frac{l'}{w'_b} \qquad (16)$$

$$\frac{l}{w_b} + \frac{l'}{w'_b} = \frac{(w_b + d_a + d - w_c)}{W} + \frac{l}{w_c} + \frac{l'}{w'_c} \qquad (17)$$

Next, based on the values of $w_a$, $w_b$, and $w_c$ provided above, respective widths of the segments 114d, 114e, 114f, 114g, 114h, and 114i which extend in the longitudinal direction are set such that the farther away from the pad 110, the wider the segment. In this case, the widths are set so as to satisfy $w_d$=150 μm, $w_e$=170 μm, $w_f$=190 μm, $w_g$=200 μm, $w_h$=220 μm, and $w_i$=240 μm. In addition, based on values of the widths of the segments, wiring widths of the segments 115d, 115e, 115f, 115g, 115h, and 115i are determined so that wiring resistances of antennas that are adjacent to each other in the longitudinal direction match each other. If a relationship satisfied between antennas 104a and 104d is adopted as an example, then expression (18) is satisfied.

$$w'_d = \frac{1}{\left(\frac{1}{w'_a} - \frac{l}{w_d l'}\right)} \quad (18)$$

Therefore, with the oscillating element according to the seventh example, the wiring resistances among the antennas can be matched with each other even when, unlike the first example, an arrangement of the antennas on the substrate is a two-dimensional array.

In the above description of the seventh example, a configuration is adopted in which widths or, in other words, sectional areas of the segments 114a to 114i and the segments 115a to 115i differ from each other in accordance with positions of the antennas 104a to 104i with respect to the pad 110. In place of or in addition to the configuration described above, a configuration may be adopted in which at least one of resistivity and lengths of the segments 114a to 114i and the segments 115a to 115i differ from each other in accordance with positions of the antennas 104a to 104i with respect to the pad 110.

Eighth Example

Figure 17:
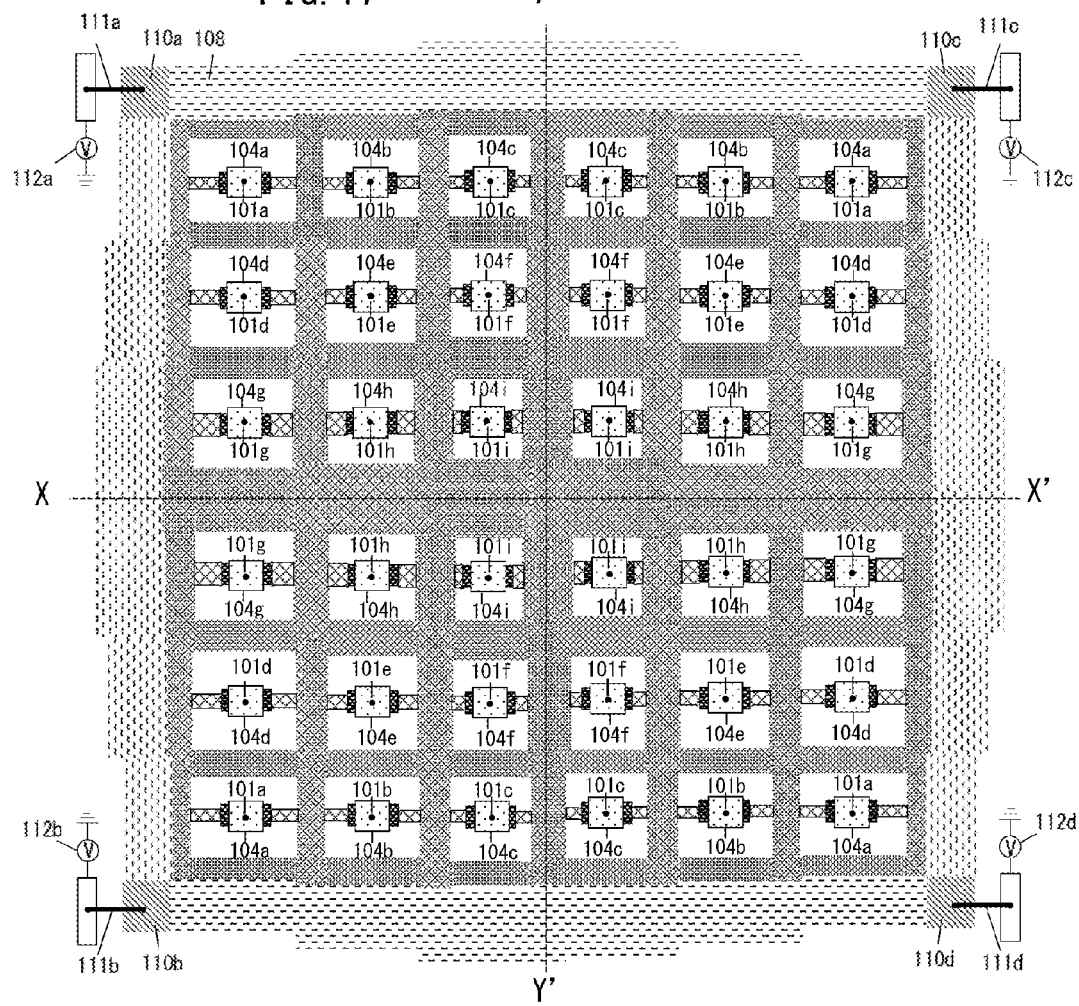
FIG. 17 is a top view schematically showing an example of an oscillating element according to an eighth example.
Figure 18:
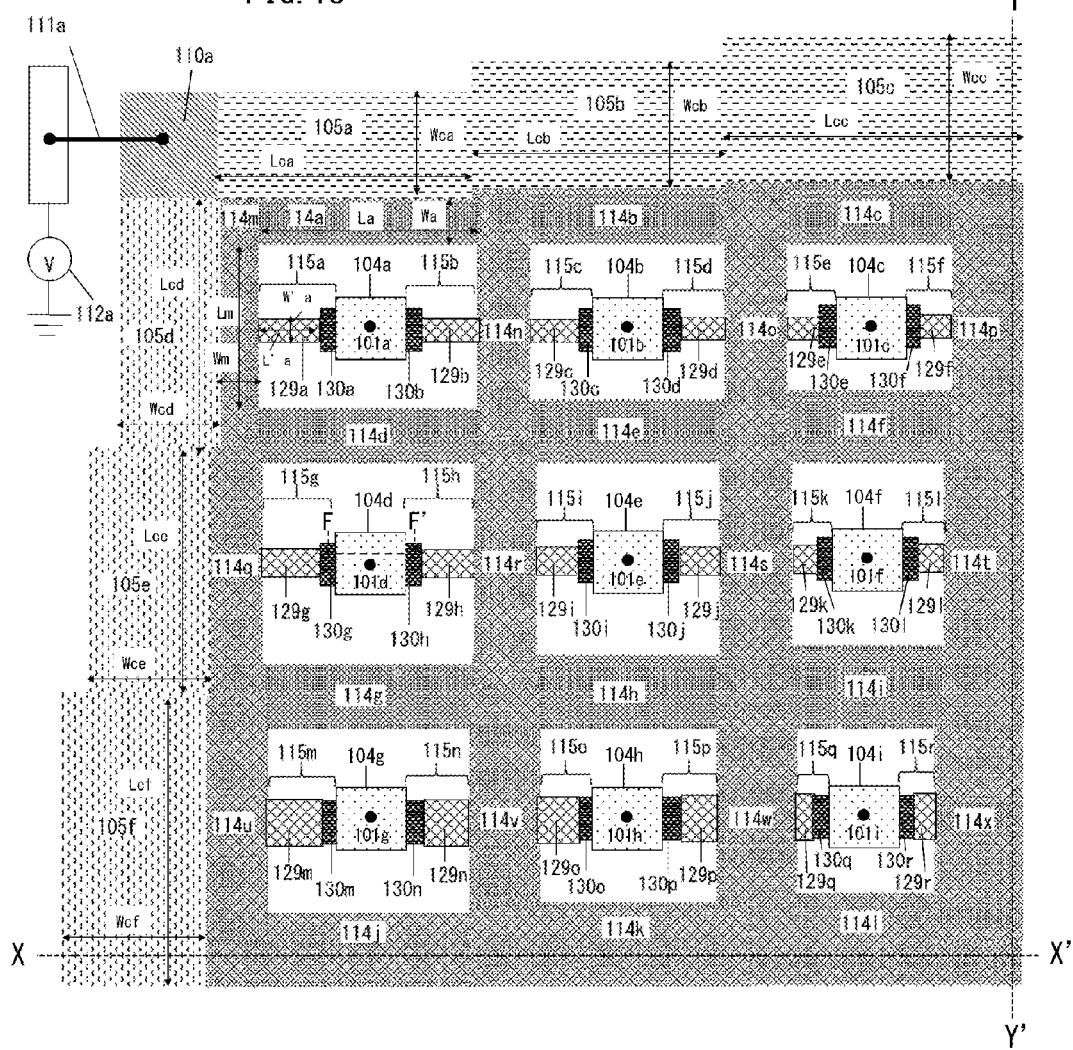
FIG. 18 is a diagram showing a part of the oscillating element shown in FIG. 17.
Figure 19:
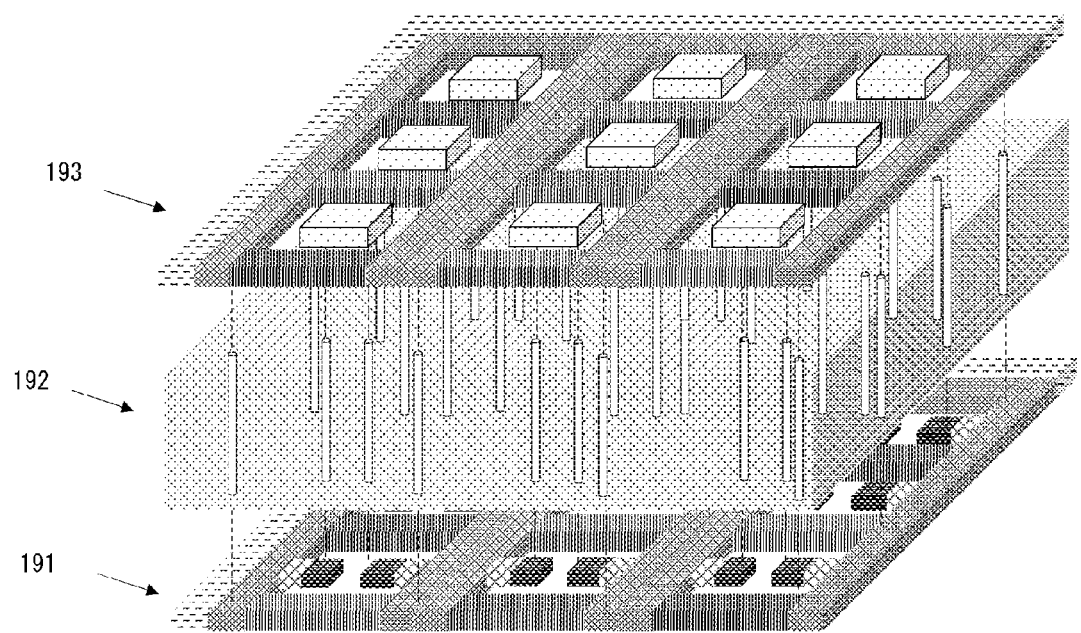
FIG. 19 is a perspective view showing fabricating steps of the oscillating element according to the eighth example.
Figure 20:
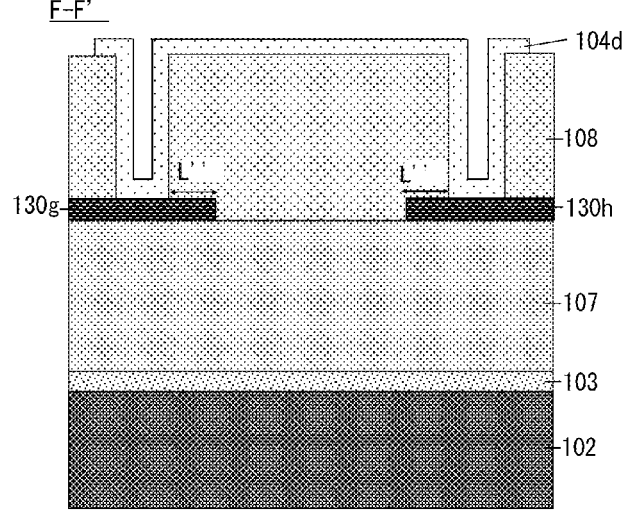
FIG. 20 is a sectional view taken along line F-F' in FIG. 18.

Next, an example of an oscillating element according to an eighth example will be described with reference to FIGS. 17 to 20. FIG. 17 is a top view schematically showing an example of the oscillating element according to the eighth example, FIG. 18 is a top view that is a cutaway of FIG. 17, and FIG. 19 is a perspective view showing a characteristic manufacturing step according to the present example among the forming steps shown in FIG. 16. FIG. 20 is a sectional view taken along line F-F' in FIG. 18.

In the present example, antennas are arranged in a two-dimensional 6 by 6 array on the second insulator 108 as shown in FIG. 17. In addition, the present example is configured such that power is fed to the respective antennas from four directions on the second insulator 108. In other words, in a similar manner to the seventh example, the bias lines which are individual wirings to the respective antennas are divided into two regions of the segments 114a to 114x and the segments 115a to 115r.

In the present example, due to symmetry of the antenna arrangement shown in FIG. 17, wiring resistances are adjusted solely by the 3 by 3 array shown in FIG. 18. FIG. 17 only shows pads 110a to 110d, wirings 111a to 111d including wire bondings, power supplies 112a to 112d, negative resistance elements 101a to 101i, and antennas 104a to 104i. Using an X-X' plane and a Y-Y' plane as symmetrical planes in FIG. 17 results in an arrangement in which four regions of 3 by 3 arrays are symmetrical to each other, whereby FIG. 18 shows a top view that is a cutaway of the 3 by 3 array including the pad 110a.

In the present example, a bias line to act as a common wiring is constituted of segments 105a to 105f, and bias lines to become wirings to the respective antennas is divided into segments 114a to 114x and segments 115a to 115r. In addition, as shown in FIG. 19, the bias line to act as a common wiring and the bias lines to become wirings to the respective antennas are formed in two layers. Wiring widths and wiring lengths of all segments that constitute first wirings of the first layer and wiring widths and wiring lengths of all segments that constitute second wirings of the second layer are equal to each other, and same reference characters are affixed to the segments constituting the first wirings and the segments constituting the second wirings. The first wirings (a portion denoted by 191 in the drawing) are formed in the steps shown in FIGS. 16D and 16J. In addition, the second wirings (a portion denoted by 193 in the drawing) are formed in the steps shown in FIGS. 16F and 16L. Furthermore, the first wirings and the second wirings are connected to each other by a second contact hole (a portion denoted by 192 in the drawing) which is formed in the steps shown in FIGS. 16E and 16K.

The segments 114a to 114x are arranged in a grid pattern and, among the segments, the segments 114a to 114l are arranged so as to extend in a transverse direction above and below each antenna while the segments 114m to 114x are arranged so as to extend in a longitudinal direction to the left and right of each antenna. A segment 115z (z=a to r) is further divided into a segment 129z (z=a to r) and a segment 130z (z=a to r). The segments 115a to 115r respectively extend in a transverse direction from the segments 114m to 114x and the segments 130a to 130r connect to the antennas 104a to 104i. In addition, wiring widths of the segments 130a to 130r are all 30 μm and wiring lengths of the segments 130a to 130r are all 15 μm. The segments 130a to 130r create a region that overlaps with the antennas 104a to 104i in a top view and, for all antennas, the overlapping region is 30 μm×5 μm. In FIG. 20, since the segments 130g and 130h and the antenna 104d become equipotential when driven, a capacitance is not generated in the second insulator 108 that is positioned between the segments 130g and 130h and the antenna 104d. Therefore, by making the overlapping regions equal for all antennas, oscillation frequencies are prevented from deviating among antennas due to factors other than wiring resistance. In FIG. 20, it is assumed that L"=5 μm. In this case, the longitudinal direction is assumed to be a direction in which the antenna 104d and the antenna 104g are arranged with the antenna 104a is a reference in FIG. 17 (an up-down direction of a paper plane in the illustrated example). The transverse direction is assumed to be a direction in which the antenna 104b and the antenna 104c are arranged with the antenna 104a as a reference in FIG. 17 (a left-right direction of the paper plane in the illustrated example).

Wiring widths of the segments 105a to 105f are set such that the farther a segment is from the pad 110a, the wider the wiring width of the segment. In a similar manner, wiring widths of the segments 114a to 114x are set such that the farther a segment is from the pad 110a, the wider the wiring width of the segment. Wiring lengths of the segments 129a to 129r are set such that the closer a segment is to the pad 110a, the longer the wiring length of the segment. Wiring lengths of the segments 105a to 105f and the segments 114a to 114x are all 300 μm. FIG. 18 shows a wiring length Lca of the segment 105a, a wiring length Lcd of the segment 105d, a wiring length La of the segment 114a, and a wiring length Lm of the segment 114m. In addition, in the present example, resistivity and film thickness are assumed to be the same for all segments. Let the wiring widths of the segments 105a to 105f be respectively denoted by Wca to Wcf. In this case, in the transverse direction, Wca, Wcb, and Wcc have a relationship expressed as Wca<Wcb<Wcc, and in the longitudinal direction, Wcd, Wce, and Wcf have a relationship expressed as Wcd<Wce<Wcf. Let the wiring widths of the segments 114a to 114x be respectively denoted by Wa to Wx. While only Wa is shown in the drawings, Wb to Wx are also wiring widths defined in a similar manner. In this case, in the longitudinal direction, Wa, Wd, Wg, and Wj have a relationship expressed as Wa<Wd<Wg<Wj, Wb, We, Wh, and Wk have a relationship expressed as Wb<We<Wh<Wk, and Wc, Wf, Wi, and Wl have a relationship expressed as Wc<Wf<Wi<Wl. In a similar manner, in the longitudinal direction, Wm, Wq, and Wu have a relationship expressed as Wm<Wq<Wu, Wn, Wr, and Wv have a relationship expressed as Wn<Wr<Wv, Wo, Ws, and Ww have a relationship expressed as Wo<Ws<Ww, and Wp, Wt, and Wx have a relationship expressed as Wp<Wt<Wx. In addition, in the transverse direction, Wa, Wb, and We have a relationship expressed as Wa<Wb<Wc, Wd, We, and Wf have a relationship expressed as Wd<We<Wf, Wg, Wh, and Wi have a relationship expressed as Wg<Wh<Wi, and Wj, Wk, and Wl have a relationship expressed as Wj<Wk<Wl. In a similar manner, in the transverse direction, Wm, Wn, Wo, and Wp have a relationship expressed as Wm<Wn<Wo<Wp, Wq, Wr, Ws, and Wt have a relationship expressed as Wq<Wr<Ws, Wt, and Wu, Wv, Ww, and Wx have a relationship expressed as Wu<Wv<Ww<Wx.

In a similar manner, as shown in the diagram, let the wiring widths of the segments 129a to 129r be respectively denoted by L'a to L'r. While only L'a is shown in the drawings, L'b to L'r are also wiring widths defined in a similar manner. In this case, in the longitudinal direction, L'a, L'g, and L'm have a relationship expressed as L'a>L'g>L'm, L'b, L'h, and L'n have a relationship expressed as L'b>L'h>L'n, and L'c, L'i, and L'o have a relationship expressed as L'c>L'i>L'o. In a similar manner, in the longitudinal direction, L'd, L'j, and L'p have a relationship expressed as L'd>L'j>L'p, L'e, L'k, and L'q have a relationship expressed as L'e>L'k>L'q, and L'1, and L'r have a relationship expressed as L'f>L'l>L'r. In addition, in the transverse direction, L'a, L'b, L'c, L'd, L'e, and L'f have a relationship expressed as L'a>L'b>L'c>L'd>L'e>L'f. In a similar manner, in the transverse direction, L'g, L'h, L'i, L'j, L'k, and L'l have a relationship expressed as L'g>L'h>L'i>L'j>L'k>L'1. In a similar manner, in the transverse direction, L'm, L'n, L'o, L'p, L'q, and L'r have a relationship expressed as L'm>L'n>L'o>L'p>L'q>L'r. In addition, let the wiring widths of the segments 129a to 129r be respectively denoted by W'a to W'r. While only W'a is shown in the drawings, W'b to W'r are also wiring widths defined in a similar manner. Moreover, it is assumed that resistivities and film thicknesses of the bias lines 105a to 105f which are wirings common to the respective antennas and the segments 114a to 114x and the segments 115a to 115r of the bias lines which are individual wirings to the respective antennas are all equal to each other. Table 1 shows correspondence between each segment and dimensions and Table 2 shows Wca to Wcf, Wa to Wx, W'a to W'r, and L'a to L'r. When calculating resistance values, a series combined resistance of the negative resistance element 101a and the antenna 104 is set to 30Ω. Values shown in Table 2 cause voltages applied to all antennas to be equal to each other.

TABLE 1

| SEGMENT | DIMENSION | SEGMENT | DIMENSION | SEGMENT | DIMENSION | SEGMENT | DIMENSION | DIMENSION |
|---|---|---|---|---|---|---|---|---|
| 105a | Wca | 114a | Wa | 114m | Wm | 129a | W'a | L'a |
| 105b | Wcb | 114b | Wb | 114n | Wn | 129b | W'b | L'b |
| 105c | Wcc | 114c | Wc | 114o | Wo | 129c | W'c | L'c |
| 105d | Wcd | 114d | Wd | 114p | Wp | 129d | W'd | L'd |
| 105e | Wce | 114e | We | 114q | Wq | 129e | W'e | L'e |
| 105f | Wcf | 114f | Wf | 114r | Wr | 129f | W'f | L'f |
|  |  | 114g | Wg | 114s | Ws | 129g | W'g | L'g |
|  |  | 114h | Wh | 114t | Wt | 129h | W'h | L'h |
|  |  | 114i | Wi | 114u | Wu | 129i | W'i | L'i |
|  |  | 114j | Wj | 114v | Wv | 129j | W'j | L'j |
|  |  | 114k | Wk | 114w | Ww | 129k | W'k | L'k |
|  |  | 114l | Wl | 114x | Wx | 129l | W'l | L'l |
|  |  |  |  |  |  | 129m | W'n | L'n |
|  |  |  |  |  |  | 129n | W'o | L'o |
|  |  |  |  |  |  | 129o | W'p | L'P |
|  |  |  |  |  |  | 129p | W'q | L'q |
|  |  |  |  |  |  | 129q | W'q | L'q |
|  |  |  |  |  |  | 129r | W'r | L'r |

TABLE 2

| DIMENSION | VALUE (μm) | DIMENSION | VALUE (μm) | DIMENSION | VALUE (μm) | DIMENSION | VALUE (μm) | DIMENSION | VALUE (μm) |
|---|---|---|---|---|---|---|---|---|---|
| Wca | 250 | Wa | 150 | Wm | 150 | W'a | 13 | L'a | 120 |
| Wcb | 313 | Wb | 158 | Wn | 158 | W'b | 14 | L'b | 110 |
| Wcc | 357 | Wc | 167 | Wo | 167 | W'c | 18 | L'c | 100 |
| Wcd | 250 | Wd | 158 | Wp | 176 | W'd | 17 | L'd | 90 |
| Wce | 313 | We | 167 | Wq | 158 | W'e | 19 | L'e | 80 |
| Wcf | 357 | Wf | 176 | Wr | 167 | W'f | 18 | L'f | 70 |
|  |  | Wg | 167 | Ws | 176 | W'g | 21 | L'g | 110 |
|  |  | Wh | 176 | Wt | 188 | W'h | 20 | L'h | 100 |
|  |  | Wi | 188 | Wu | 167 | W'i | 29 | L'i | 90 |

TABLE 2-continued

| DIMENSION | VALUE (μm) | DIMENSION | VALUE (μm) | DIMENSION | VALUE (μm) | DIMENSION | VALUE (μm) | DIMENSION | VALUE (μm) |
|---|---|---|---|---|---|---|---|---|---|
| | | W j | 176 | W v | 188 | W' j | 29 | L' j | 80 |
| | | W k | 200 | W w | 200 | W' k | 35 | L' k | 70 |
| | | W l | 214 | W x | 214 | W' l | 35 | L' l | 60 |
| | | | | | | W' m | 26 | L' m | 100 |
| | | | | | | W' n | 27 | L' n | 90 |
| | | | | | | W' o | 40 | L' o | 80 |
| | | | | | | W' p | 40 | L' p | 70 |
| | | | | | | W' q | 50 | L' q | 60 |
| | | | | | | W' r | 54 | L' r | 50 |

Therefore, with the oscillating element according to the eighth example, even when the number of two-dimensional arrays are increased as compared to the seventh example, voltage drops can be made equal to each other among antennas while preventing wiring widths and wiring lengths from increasing due to arrangements of wirings in a grid pattern and forming wirings in two layers.

According to the present disclosure, sufficient output can be obtained when synthesizing electromagnetic waves of antennas in an oscillating element.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-023370, filed on Feb. 17, 2021 and Japanese Patent Application No. 2022-001697, filed on Jan. 7, 2022, which are hereby incorporated by reference herein in their entirety.

What is claimed is:

1. An oscillating element comprising:
   a substrate;
   a plurality of negative resistance elements that are electrically connected to the substrate;
   a plurality of antennas that transmit or receive an electromagnetic wave, each of the plurality of antennas having at least one of the plurality of negative resistance elements;
   a pad electrically connected to a power supply source for supplying power to the plurality of antennas; and
   a conductor that electrically connects the pad and the plurality of antennas to each other, wherein
   the conductor is constituted of a common wiring that is common to the plurality of antennas and individual wirings from the common wiring to each of the plurality of antennas, and
   wherein the individual wirings include at least two individual wirings that differ from each other with respect to at least one of a sectional area, resistivity, and a length in accordance with a position on the substrate of an antenna connected to each of the at least two individual wirings so as to reduce a difference in wiring resistances that is caused based on a distance between the antenna connected to each of the at least two individual wirings and the pad.

2. The oscillating element according to claim 1, wherein the closer the position on the substrate of an antenna connected to each of the at least two individual wirings is to the pad, the longer a length of the wiring.

3. The oscillating element according to claim 1, wherein the closer the position on the substrate of an antenna connected to each of the at least two individual wirings is to the pad, the smaller a sectional area of the wiring.

4. The oscillating element according to claim 1, wherein the pad is arranged in plurality on the substrate, and
   wherein the respective wirings differ from each other with respect to at least one of a sectional area, resistivity, and a length in accordance with a position on the substrate of an antenna connected to each of the at least two individual wirings so as to reduce a difference between synthesized wiring resistances from the plurality of pads to the respective antennas.

5. The oscillating element according to claim 1, wherein the individual wirings are constituted by a plurality of materials.

6. The oscillating element according to claim 5, wherein the individual wirings are constructed by electrically connecting a first wiring formed by a first material among the plurality of materials in a first layer and a second wiring formed by a second material among the plurality of materials in a second layer to each other on the substrate.

7. The oscillating element according to claim 1, wherein the individual wirings have a first segment to be a wiring of at least two antennas among the plurality of antennas and a second segment electrically connected from the first segment to each of the at least two antennas, and
   wherein at least one of a sectional area, resistivity, and a length of at least one of the first segment and the second segment differs from each other in accordance with a position on the substrate of the antenna connected to each of the at least two individual wirings.

8. The oscillating element according to claim 1, wherein an interval among the plurality of antennas is equal to or shorter than a wavelength or an integral multiple of the wavelength of an oscillating electromagnetic wave.

9. The oscillating element according to claim 1, wherein the antenna outputs an electromagnetic wave including a component with a frequency ranging from 30 GHz to 30 THz.

10. The oscillating element according to claim 1, wherein each of the plurality of negative resistance elements is a resonant tunneling diode.

* * * * *